(12) United States Patent
Asnaashari

(10) Patent No.: US 12,087,397 B1
(45) Date of Patent: Sep. 10, 2024

(54) DYNAMIC HOST ALLOCATION OF PHYSICAL UNCLONABLE FEATURE OPERATION FOR RESISTIVE SWITCHING MEMORY

(71) Applicant: Crossbar, Inc., Santa Clara, CA (US)

(72) Inventor: Mehdi Asnaashari, Danville, CA (US)

(73) Assignee: Crossbar, Inc., Santa Clara, CA (US)

(*) Notice: Subject to any disclaimer, the term of this patent is extended or adjusted under 35 U.S.C. 154(b) by 226 days.

(21) Appl. No.: 17/708,491

(22) Filed: Mar. 30, 2022

Related U.S. Application Data

(63) Continuation-in-part of application No. 17/223,824, filed on Apr. 6, 2021, now Pat. No. 11,430,517.

(Continued)

(51) Int. Cl.
G11C 7/00 (2006.01)
G06F 3/06 (2006.01)
(Continued)

(52) U.S. Cl.
CPC .............. *G11C 7/24* (2013.01); *G06F 3/0604* (2013.01); *G06F 3/0655* (2013.01);
(Continued)

(58) Field of Classification Search
CPC ..... G11C 7/24; G11C 13/004; G11C 13/0059; G11C 16/08; G11C 16/16; G11C 16/22;
(Continued)

(56) References Cited

U.S. PATENT DOCUMENTS 5,270,590 A 12/1993 Pascucci
5,491,662 A 2/1996 Pezzini
(Continued)

FOREIGN PATENT DOCUMENTS

| CN | 111952333 A | 11/2020 |
|---|---|---|
| WO | 0030118 A1 | 5/2000 |
| WO | 2013-126109 A1 | 8/2013 |

OTHER PUBLICATIONS

Notice of Allowance for U.S. Appl. No. 17/503,890 dated Mar. 27, 2023, 9 pages long.

(Continued)

*Primary Examiner* — Thong Q Le
(74) *Attorney, Agent, or Firm* — Wegman Hessler Valore

(57) ABSTRACT

An integrated circuit device can be configured to characterize portions of a resistive switching device array according to one or more operational characterizations. The memory device can store trim instructions defining signal processes for implementing the operational characterizations. Examples of resistive switching device characterizations can include: a physical unclonable feature (PUF) memory characterization, a one-time programmable (OTP) memory characterization, a many-time programmable (MTP) memory characterization, and a random number generation (RNG) memory characterization, among others. The integrated circuit device can characterize portions of the resistive switching device array in response to an instruction from an external host device, exposing control over the selective characterization of the portions of the resistive switching device array to the external host device.

20 Claims, 15 Drawing Sheets

Related U.S. Application Data

(60) Provisional application No. 63/005,879, filed on Apr. 6, 2020.

(51) Int. Cl.
*G11C 7/24* (2006.01)
*G11C 13/00* (2006.01)

(52) U.S. Cl.
CPC ........ *G06F 3/0673* (2013.01); *G11C 13/0023* (2013.01); *G11C 13/0069* (2013.01); *G11C 13/0097* (2013.01)

(58) Field of Classification Search
CPC ......... G11C 16/26; G11C 16/34; G11C 11/56; G11C 13/0023; G11C 13/0026; G11C 13/0028; G11C 13/0069; G11C 2013/0054; G11C 13/0064; G11C 2029/4402; G11C 2029/5002; G11C 8/20; G06F 12/0246; G06F 12/1009; G06F 12/1475; G06F 3/0688; G06F 21/72; G06F 13/1668; G06F 21/44; G06F 21/73; G06F 21/34; G06F 21/52; G06F 21/75; G06F 21/78
See application file for complete search history.

(56) References Cited

U.S. PATENT DOCUMENTS

| | | | |
|---|---|---|---|
| 5,629,892 A | 5/1997 | Tang | |
| 5,828,601 A | 10/1998 | Hollmer | |
| 6,057,575 A | 5/2000 | Jenq | |
| 6,128,226 A | 10/2000 | Eitan et al. | |
| 6,268,247 B1 | 7/2001 | Cremonesi et al. | |
| 7,715,246 B1 | 5/2010 | Kim | |
| 7,848,130 B1 | 12/2010 | Thummalapally et al. | |
| 8,279,657 B2 | 10/2012 | Takagi et al. | |
| 8,995,200 B1 | 3/2015 | Mu et al. | |
| 9,276,210 B1 | 3/2016 | Tendulkar | |
| 9,318,196 B1 | 4/2016 | Kasai et al. | |
| 9,466,376 B1 | 10/2016 | Lee et al. | |
| 9,502,110 B1 | 11/2016 | Tailliet | |
| 9,767,901 B1 | 9/2017 | Sharma et al. | |
| 10,572,190 B2 | 2/2020 | Shieh | |
| 10,700,878 B1 | 6/2020 | Ryu | |
| 10,910,051 B1 | 2/2021 | Huang | |
| 10,990,542 B2 * | 4/2021 | Ju ....................... G06F 12/1475 |
| 11,537,754 B1 | 12/2022 | Jameson | |
| 2003/0016572 A1 | 1/2003 | Pascucci | |
| 2004/0136238 A1 | 7/2004 | Wuidart et al. | |
| 2004/0141379 A1 | 7/2004 | La Malfa et al. | |
| 2005/0105329 A1 | 5/2005 | Nazarian | |
| 2005/0270833 A1 | 12/2005 | Seevinck et al. | |
| 2006/0044049 A1 | 3/2006 | Ouellette | |
| 2007/0242518 A1 | 10/2007 | Seidel | |
| 2007/0274120 A1 | 11/2007 | Pinnow et al. | |
| 2008/0025068 A1 | 1/2008 | Scheuerlein et al. | |
| 2008/0137436 A1 | 6/2008 | Salter et al. | |
| 2008/0176349 A1 | 7/2008 | Suh et al. | |
| 2008/0198640 A1 | 8/2008 | Leistad | |
| 2009/0212347 A1 | 8/2009 | Goarin et al. | |
| 2009/0285007 A1 | 11/2009 | Majewski et al. | |
| 2010/0054045 A1 | 3/2010 | Ho et al. | |
| 2010/0102313 A1 | 4/2010 | Miyairi et al. | |
| 2011/0051500 A1 | 3/2011 | Takagi et al. | |
| 2011/0062433 A1 | 3/2011 | Yamazaki | |
| 2011/0062435 A1 | 3/2011 | Yamazaki et al. | |
| 2011/0069554 A1 | 3/2011 | Lo Giudice et al. | |
| 2011/0122714 A1 | 5/2011 | Chen et al. | |
| 2012/0005558 A1 | 1/2012 | Steiner et al. | |
| 2012/0069622 A1 | 3/2012 | Parkinson et al. | |
| 2012/0081946 A1 | 4/2012 | Kawabata | |
| 2012/0239976 A1 | 9/2012 | Cometti et al. | |
| 2012/0243346 A1 | 9/2012 | Chen et al. | |
| 2013/0094294 A1 | 4/2013 | Kwak et al. | |
| 2013/0301336 A1 | 11/2013 | Sills | |
| 2014/0027699 A1 | 1/2014 | Aoki et al. | |
| 2014/0036587 A1 | 2/2014 | Tannhof et al. | |
| 2014/0173184 A1 | 6/2014 | Kim et al. | |
| 2014/0226391 A1 | 8/2014 | Perniola | |
| 2014/0233339 A1 | 8/2014 | Givant et al. | |
| 2014/0372743 A1 | 12/2014 | Rogers et al. | |
| 2015/0378815 A1 | 12/2015 | Goda et al. | |
| 2016/0086670 A1 | 3/2016 | Gross et al. | |
| 2016/0099810 A1 | 4/2016 | Li et al. | |
| 2016/0165642 A1 | 6/2016 | Lunden et al. | |
| 2016/0225824 A1 | 8/2016 | Jo et al. | |
| 2017/0048849 A1 | 2/2017 | Fiallos et al. | |
| 2017/0062049 A1 | 3/2017 | Roy | |
| 2017/0200508 A1 | 7/2017 | Grigoriev | |
| 2017/0212687 A1 | 7/2017 | Kelly | |
| 2017/0272258 A1 | 9/2017 | Tanamoto | |
| 2017/0278577 A1 | 9/2017 | La Rosa et al. | |
| 2018/0137927 A1 | 5/2018 | Zhang | |
| 2018/0176012 A1 | 6/2018 | Hung | |
| 2018/0316493 A1 | 11/2018 | Kvatinsky | |
| 2018/0349148 A1 | 12/2018 | Ish | |
| 2019/0103162 A1 | 4/2019 | Asnaashari et al. | |
| 2019/0130953 A1 | 5/2019 | Lee et al. | |
| 2019/0130971 A1 | 5/2019 | Rajamohanan | |
| 2019/0198099 A1 | 6/2019 | Mirichigni et al. | |
| 2019/0215739 A1 | 7/2019 | Quan | |
| 2019/0252029 A1 | 8/2019 | Lai et al. | |
| 2019/0253266 A1 | 8/2019 | Lee | |
| 2019/0259452 A1 | 8/2019 | Asnaashari | |
| 2019/0272115 A1 | 9/2019 | Hu | |
| 2019/0272882 A1 | 9/2019 | Guy et al. | |
| 2019/0278687 A1 | 9/2019 | Kameo | |
| 2019/0279709 A1 | 9/2019 | Lee | |
| 2019/0304527 A1 | 10/2019 | Kim | |
| 2019/0304557 A1 | 10/2019 | Her et al. | |
| 2019/0348112 A1 | 11/2019 | Gopinath | |
| 2020/0066984 A1 | 2/2020 | Liu | |
| 2020/0183614 A1 | 6/2020 | Kim | |
| 2020/0186339 A1 | 6/2020 | Hung | |
| 2020/0192970 A1 | 6/2020 | Ma | |
| 2020/0196101 A1 | 6/2020 | Edge | |
| 2020/0259081 A1 | 8/2020 | Jo et al. | |
| 2020/0295249 A1 | 9/2020 | Ambrose | |
| 2020/0312408 A1 | 10/2020 | Ciprut | |
| 2020/0350030 A1 | 11/2020 | Zhang | |
| 2020/0381372 A1 | 12/2020 | Kozicki | |
| 2021/0083886 A1 | 3/2021 | Lee | |
| 2021/0135886 A1 | 5/2021 | Lee | |
| 2021/0203513 A1 | 7/2021 | Chang | |
| 2021/0280781 A1 | 9/2021 | Kim | |
| 2021/0312984 A1 | 10/2021 | Jo et al. | |
| 2021/0312985 A1 | 10/2021 | Jo et al. | |
| 2022/0005527 A1 | 1/2022 | Nazarian | |
| 2022/0029835 A1 | 1/2022 | Fourquin | |
| 2022/0146922 A1 | 5/2022 | Otsuka et al. | |
| 2022/0199187 A1 | 6/2022 | Rayaprolu et al. | |
| 2022/0232360 A1 | 7/2022 | Wei et al. | |

OTHER PUBLICATIONS

Final Office Action for U.S. Appl. No. 17/899,356 dated Jul. 12, 2023, 13 pages long.
Shrivastava, Ayush, RRAM-based PUF: Design and Applications in Cryptography, Aug. 2015, Arizona State University, 68 pages.
Notice of Allowance for U.S. Appl. No. 17/503,924 dated Jul. 14, 2023, 19 pages long.
Seyed Nima Mozaffari Mojaveri, "Design and Test of Digital Circuits and Systems Using CMOS and Emerging Resistive Devices", May 1, 2018, Southern Illinois University at Carbondale, All pages.
Notice of Allowance for U.S. Appl. No. 17/223,817 dated Mar. 10, 2022, 12 pages long.
Notice of Allowance for U.S. Appl. No. 17/223,827 dated Apr. 26, 2022, 15 pages long.
Notice of Allowance for U.S. Appl. No. 17/223,832 dated May 2, 2022, 13 pages long.

(56) References Cited

OTHER PUBLICATIONS

Meng-Yi Wu, et al., "A PUF Scheme Using Competing Oxide Rupture with Bit Error Rate Approaching Zero", ISSCC 2018, Session 7, Neuromorphic, Clocking and Security Circuits 7.7, 2018 IEEE International Solid-State Circuits Conference, pp. 130-132.
Non-Final Office Action for U.S. Appl. No. 17/899,356 dated Mar. 7, 2023, 21 pages long.
Non-Final Office Action for U.S. Appl. No. 17/503,924 dated Mar. 27, 2023, 23 pages long.
Notice of Allowance for U.S. Appl. No. 17/899,356 dated Oct. 19, 2023, 18 pages long.

* cited by examiner

DYNAMIC HOST ALLOCATION OF PHYSICAL UNCLONABLE FEATURE OPERATION FOR RESISTIVE SWITCHING MEMORY

CROSS REFERENCE TO RELATED APPLICATION

The present application for patent is a continuation-in-part of U.S. patent application Ser. No. 17/223,824 filed Apr. 6, 2021 and titled DISTINCT CHIP IDENTIFIER SEQUENCE UTILIZING UNCLONABLE CHARACTERISTICS OF RESISTIVE MEMORY ON A CHIP, which claims the benefit of U.S. Provisional Application No. 63/005,879 filed Apr. 6, 2020, each of which are hereby incorporated by reference herein in their respective entireties and for all purposes.

INCORPORATION BY REFERENCE

Each of the following: U.S. patent application Ser. No. 17/223,817 filed Apr. 6, 2021, and U.S. patent application Ser. No. 17/223,816 filed Apr. 6, 2021, are hereby incorporated by reference herein in their respective entireties and for all purposes.

TECHNICAL FIELD

The subject disclosure relates generally to two-terminal resistive switching memory, and as one illustrative example, enabling a host device to characterize cells of a resistive switching memory for differing cell operations.

BACKGROUND

Resistive-switching memory represents a recent innovation within the field of integrated circuit technology. While much of resistive-switching memory technology is in the development stage, various technological concepts for resistive-switching memory have been demonstrated and are in one or more stages of verification to prove or disprove associated theories or techniques. Resistive-switching memory technology is expected to show compelling evidence of substantial advantages over competing technologies in the semiconductor electronics industry in the near future.

Proposals for practical utilization of resistive-switching technology to memory applications for electronic devices have been put forth. For instance, resistive-switching elements are often theorized as viable alternatives, at least in part, to metal-oxide semiconductor (MOS) type memory transistors employed for electronic storage of digital information. Models of resistive-switching memory devices provide some potential technical advantages over non-volatile FLASH MOS type transistors, for instance.

Monolithic integration of resistive-switching memory within integrated circuit processes has been supported by other proposed models. Some models of resistive-switching memory are designed for front-end-of-line processing on a substrate, whereas other models are designed for back-end-of-line processing above the substrate. As a result, resistive-switching memory is expected to be compatible with embedded memory applications to support various integrated circuit devices as well as a stand-alone integrated circuit memory chip.

In light of the above, the Assignee of the present disclosure continues to develop and pursue practical utilizations of resistive-switching technology.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Embodiments of the present disclosure provide a memory device comprising an array of resistive switching memory cells. According to various embodiments, the memory device is configured to characterize subsets of resistive switching memory cells of the array in response to a host command. The memory device can store trim instructions defining memory characterizations and suitable operations consistent with the memory cell characterizations. Examples of memory characterizations disclosed herein include: a physical unclonable feature (PUF) memory characterization, a one-time programmable (OTP) memory characterization, a many-time programmable (MTP) memory characterization, and a random number generation (RNG) memory characterization, among others. Upon decoding the host command, the memory device can determine an operation command and one or more addresses of memory cells specified by the host command. Stored trim instructions can be referenced to configure memory cells at addresses specified by the host command consistent with a characterization associated with the operation command, and implement the operation command consistent with the characterization. In at least some embodiments, the host command can specify a type of operation to be implemented on specific memory addresses of a resistive switching memory array. The type of operation can include a PUF operation, an OTP operation, a MTP operation or a RNG operation, among others. In response to the host command, a disclosed memory device can prepare memory cells at the specified memory addresses for the type of operation based on stored trim instructions, and implement the operation at least in part on the specified memory addresses.

In one or more embodiments of the present disclosure, provided is an electronic device. The electronic device can comprise an interface configured to receive at the electronic device a communication from a host device that is external to the electronic device, wherein the communication includes first data indicative of an address of a group of memory cells of the plurality of resistive switching memory cells of the resistive switching memory array for implementing a memory command and second data specifying the memory command from a set of memory commands. Additionally, the electronic device can comprise a set of trims that store instructions for configuring the resistive switching memory array to implement memory commands of the set of memory commands and for executing the memory command, wherein the set of trims includes a first trim defining a configuration of the resistive switching memory array and of program signal characteristics for implementing a physical unclonable feature (PUF) write command for the group of memory cells. Further, the electronic device can comprise a memory controller configured to characterize the group of memory cells associated with the address indicated by the first data with a characterization matching the memory command specified by the second data. The memory controller can also be configured to implement the memory command at least on the group of the plurality of resistive switching memory cells having the characterization consistent with the memory command. In addition, the memory controller can be configured to characterize the group of memory cells as PUF memory cells in response to the memory command being the PUF write command and implement the PUF write command on a set of native resistive switching memory cells of the plurality of resistive switching memory cells that includes at least the group of memory cells in response to the memory command being the PUF write command.

In further disclosed embodiments, there is described a method for operating a memory controller of a resistive switching memory array comprising a plurality of resistive switching memory cells. The method can comprise receiving a command from a host device external to the resistive switching memory array, and can comprise decoding the command to determine a selection of memory cells of the resistive switching memory array. In some embodiments, the selection of memory cells can be a portion of the plurality of resistive switching memory cells. The method can also comprise determining a memory operation to be implemented on the selection of memory cells in response to the command, the memory operation is determined to be one memory operation selected from a group of memory operations consisting of: a one-time programmable (OTP) memory operation, a many-time programmable (MTP) memory operation, a random number generation (RNG) memory operation and a physical unclonable feature (PUF) memory operation. Additionally, in response to determining the memory operation is the RNG memory operation or the PUF memory operation, the method can further comprise enabling differential programming for the selection of memory cells, and implementing the RNG memory operation or the PUF memory operation at least on the selection of memory cells.

In still further embodiments, disclosed is a method. The method can comprise receiving at a resistive switching memory device over an external command interface an instruction from a host device external to the resistive switching memory device, and decoding the instruction. The method can further comprise determining, from the decoded instruction, an address within an array of resistive switching memory associated with a group of resistive switching memory cells of the array. In response to the address within the array of resistive switching memory having no pre-assigned characterization defining a memory command for the address, the method can additionally comprise determining a memory command from the decoded instruction or provided in conjunction with the instruction, characterizing the group of resistive switching memory cells at the address according to the determined memory command and implementing the memory command at least on the group of resistive switching memory cells.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Introduction

Figure 1:
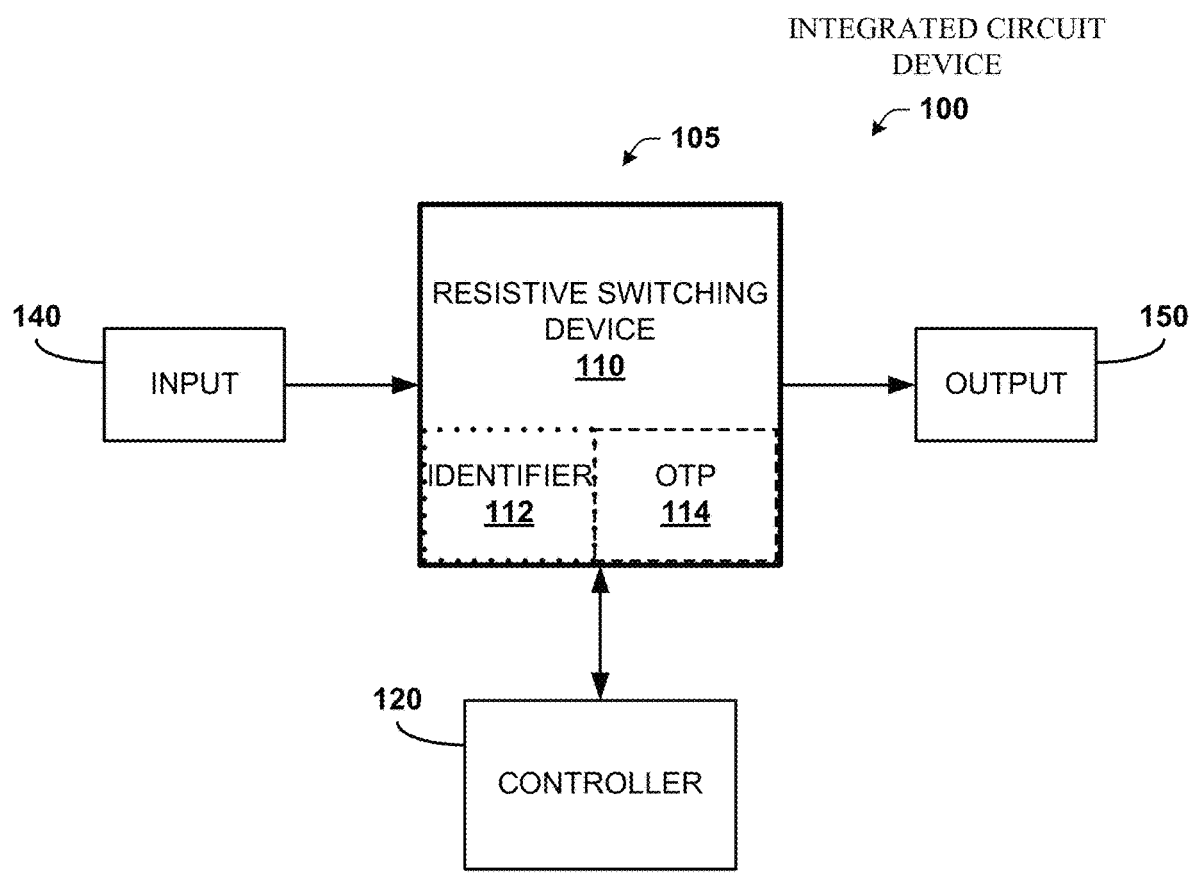
FIG. 1 depicts a block diagram of a sample electronic device for operationally characterizing subsets of resistive switching (RS) devices in an array, in some embodiments.

One or more embodiments of the present disclosure provide a two-terminal resistive switching memory array in which subsets of memory cells of the array can be characterized or configured for disparate operations, including operations not traditionally associated with non-volatile memory. Examples of non-traditional operations can include random number generation (RNG) operations and physical unclonable feature (PUF) operations by applying disclosed signal processes and digitizing results of those signal processes. In addition to the foregoing, disclosed resistive switching memory arrays can export operational characterization to an external host device in one or more disclosed embodiments. In at least one embodiment, a host command can specify (or imply) a type of operation for memory cells at an identified address. A disclosed resistive switching memory device can decode the command, determine the type of operation, characterize memory cells at the identified address for the type of operation in response to the host command, and implement the type of operation on the characterized memory cells.

Embodiments of the present disclosure provide mechanisms by which a host device can characterize subsets of an array of resistive switching memory devices for particular types of operation. Trim settings stored at the array or at a memory device comprising the array can store configuration settings and operation requirements for a set of operation types. Examples of such operation types can include: many-time programmable (MTP) operation—also referred to as rewritable operation, one-time programmable (OTP) operation, RNG operation and PUF operation, among other types of operations. By reference the trim settings, a disclosed memory controller can characterize or configure memory devices for a particular type of operation, and determine requirements (e.g., applied signal characteristics, differential program constraints—e.g., see FIGS. 6-8, infra, or the like) to implement the operations on the resistive switching memory devices. In one embodiment, a host device command can explicitly specify a selected operation type from a set of operation types stored in trim settings of the memory device. In another embodiment, the host device can set 'high' a hi/low pin of a set of hi/low pins respectively assigned to the types of operation in conjunction with a host device command. In yet another embodiment, groups of addresses of the array can be pre-assigned to respective operation types, and a host command can specify an address pre-assigned to one operation type to instruct the memory device to execute the pre-assigned operation type of memory cells located (or associated with, in the case of a virtual addressing system) at the specified address.

A PUF operation (also referred to herein as an identifier operation—e.g., producing substantially unique data—or other suitable nomenclature) can leverage stochastic or substantially stochastic physical characteristics of nanoscale resistive switching devices to generate data. Being generally random, stochastic features of resistive switching devices can be leveraged to produce data that has little to no correlation among individual resistive switching memory devices of an array of such resistive switching memory devices. As a result, that data can be suited to applications requiring distinct or unique identification, such as identification and authorization applications pertaining to a device (e.g., a semiconductor die—also referred to herein as a semiconductor chip—or a semiconductor wafer, group(s) of dies, group(s) of wafers, an electronic device incorporating a semiconductor die(s), and so forth). Thus, in some examples, identifier data according to various embodiments of the present disclosure can generate a chip ID utilizing a resistive switching array fabricated on a given chip. Further, highly non-correlated data can also be utilized for security applications, such as random number generation, cryptography key security applications, such as Elliptic Curve cryptography (ECC), Advanced Encryption System (AES) or hash-based message authentication code (HMAC), and the like.

In addition, stochastic characteristics of disclosed resistive switching device processes can be utilized to generate high-entropic data sequences that meet or exceed scientific standards for randomness, and are comparable with high-quality cryptographic random number sources. Moreover, the switching device processes utilized to generate data sequences can be selected from native resistive switching devices (e.g., devices that have not previously been programmed, and are original or virgin devices post-fabrication) that most closely leverage nano-scale unclonable physical characteristics of the resistive switching devices. This achieves high non-correlation among devices on a die (intra-die), among dies on a wafer (inter-die) and among wafers in a fabrication facility.

In one or more additional embodiments, some disclosed sequence generation processes can be rendered permanent through one-time programmable processes, allowing a sequence to be reliably re-read over a very large number of read cycles to reliably and accurately reproduce a previously generated data sequence, achieving extremely low bit error rates. In still further embodiments, disclosed processes for generating non-correlated data sequences can involve processes compatible with two-terminal resistive switching device operation, allowing a set of two-terminal resistive switching devices to be selected post-fabrication from any suitable subset of such devices within an array or selected from different resistive switching device arrays on a chip. Systems and methods are further provided to export control of resistive switching device selection, data sequence process selection and process configuration—associated with physically unclonable data sequence generation disclosed herein—to a host device external to the chip following fabrication of the chip. Various other embodiments will be readily apparent based on the disclosure herein and the associated drawings.

As the name implies, a two-terminal resistive switching device has two terminals or electrodes. Herein, the terms "electrode" and "terminal" are used interchangeably; moreover, a two-terminal resistive switching device includes a non-volatile two-terminal memory device as well as a volatile two-terminal switching device. Generally, a first electrode of a two-terminal resistive switching device is referred to as a "top electrode" (TE) and a second electrode of the two-terminal resistive switching device is referred to as a "bottom electrode" (BE), although it is understood that electrodes of two-terminal resistive switching devices can be according to any suitable arrangement, including a horizontal arrangement in which components of a memory cell are (substantially) side-by-side rather than overlying one another. Between the TE and BE of a two-terminal resistive switching device is typically an interface layer sometimes referred to as a switching layer, a resistive switching medium (RSM) or a resistive switching layer (RSL); such devices are not limited to these layers, however, as one or more barrier layer(s), adhesion layer(s), ion conduction layer(s), seed layer(s), particle source layer(s) or the like—as disclosed herein, disclosed within a publication incorporated by reference herein, as generally understood and utilized in the art or reasonably conveyed to one of ordinary skill in the art by way of the context provided herein and its addition to the general understanding in the art or the incorporated publications—may be included between or adjacent one or more of the TE, the BE or the interface layer consistent with suitable operation of such device.

Composition of memory cells, generally speaking, can vary per device with different components, materials or deposition processes selected to achieve desired characteristics (e.g., stoichiometry/non-stoichiometry, volatility/non-volatility, on/off current ratio, switching time, read time, memory durability, program/erase cycle, and so on). One example of a filamentary-based device can comprise: a conductive layer, e.g., metal, metal-alloy, metal-nitride, (e.g., comprising TiN, TaN, TiW, or other suitable metal compounds), an optional interface layer (e.g., doped p-type (or n-type) silicon (Si) bearing layer (e.g., a p-type or n-type Si bearing layer, p-type or n-type polysilicon, p-type or n-type polycrystalline SiGe, etc.)), a resistive switching layer (RSL) and an active metal-containing layer capable of being ionized. Under suitable conditions, the active metal-containing layer can provide filament-forming ions to the RSL. In such embodiments, a conductive filament (e.g., formed by the ions) can facilitate electrical conductivity through at least a subset of the RSL, and a resistance of the filament-based device can be determined, as one example, by a tunneling resistance between the filament and the conductive layer. A memory cell having such characteristics may be described as a filamentary-based device.

A RSL (which can also be referred to in the art as a resistive switching media (RSM)) can comprise, e.g., an undoped amorphous Si-containing layer, a semiconductor layer having intrinsic characteristics, a stoichiometric or non-stoichiometric silicon nitride (e.g., SiN, $Si_3N_4$, $SiN_x$, etc.), a Si sub-oxide (e.g., $SiO_x$ wherein x has a value between 0.1 and 2), a Si sub-nitride, a metal oxide, a metal nitride, a non-stoichiometric silicon compound, and so forth. Other examples of materials suitable for the RSL could include $Si_xGe_yO_z$ (where x, y and z are respective suitable positive numbers), a silicon oxide (e.g., $SiO_N$, where N is a suitable positive number), a silicon oxynitride, an undoped amorphous Si (a-Si), amorphous SiGe (a-SiGe), $TaO_B$ (where B is a suitable positive number), $HfO_C$ (where C is a suitable positive number), $TiO_D$ (where D is a suitable number), $Al_2O_E$ (where E is a suitable positive number) and so forth, a nitride (e.g., AlN, SiN), or a suitable combination thereof.

In some embodiments, a RSL employed as part of a non-volatile memory device (non-volatile RSL) can include a relatively large number (e.g., compared to a volatile selector device) of material voids or defects to trap neutral metal particles (e.g., at low voltage) within the RSL. The large number of voids or defects can facilitate formation of a thick, stable structure of the neutral metal particles. In such a structure, these trapped particles can maintain the non-volatile memory device in a low resistance state in the absence of an external stimulus (e.g., electrical power), thereby achieving non-volatile operation. In other embodiments, a RSL employed for a volatile selector device (volatile RSL) can have very few material voids or defects for trapping particles. Because of the few particle-trapping voids/defects, a conductive filament formed in such an RSL can be quite thin (e.g., one to a few particles wide depending on field strength, particle material or RSL material, or a suitable combination of the foregoing), and unstable absent a suitably high external stimulus (e.g., a non-zero electric field, voltage, current, joule heating, or a suitable combination thereof). Moreover, the particles can be selected to have high surface energy, and good diffusivity within the RSL. This leads to a conductive filament that can form rapidly in response to a suitable stimulus, but also deform quite readily, e.g., in response to the external stimulus dropping below a deformation magnitude (which can be lower than a formation magnitude of the external stimulus associated with forming the volatile conductive filament, e.g., in response to a current flowing through the selector device; see U.S. Pat. No. 9,633,724 B2 hereby incorporated by reference herein in its entirety and for all purposes). Note that a volatile RSL and conductive filament for the selector device can have different electrical characteristics than a conductive filament and non-volatile RSL for the non-volatile memory device. For instance, the selector device RSL can have higher material electrical resistance, and can have higher on/off current ratio, among others.

An active metal-containing layer for a filamentary-based memory cell can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), hafnium (Hf), and palladium (Pd). Other suitable conductive materials, as well as stoichiometric or non-stoichiometric: compounds, nitrides, oxides, alloys, mixtures or combinations of the foregoing or similar materials can be employed for the active metal-containing layer in some aspects of the subject disclosure. Further, a non-stoichiometric compound, such as a non-stoichiometric metal oxide/metal-oxygen or metal nitride/metal nitrogen (e.g., $AlO_x$, $AlN_x$, $CuO_x$, $CuN_x$, $AgO_x$, $AgN_x$, and so forth, where x is a suitable positive number or range of numbers, such as: $0<x<2$, $0<x<3$, $0<x<4$ or other number/range of numbers depending on metal compound, which can have differing values for differing ones of the non-stoichiometric compounds) or other suitable metal compound can be employed for the active metal-containing layer, in at least one embodiment.

In one or more embodiments, a disclosed filamentary resistive switching device can include an active metal layer comprising a metal-nitrogen selected from the group consisting of: $TiN_x$, $TaN_x$, $AlN_x$, $CuN_x$, $WN_x$ and $AgN_x$, where x is a positive number (or range of numbers) that can vary per metal-nitrogen material. In a further embodiment(s), the active metal layer can comprise a metal-oxygen selected from the group consisting of: $TiO_x$, $TaO_x$, $AlO_x$, $CuO_x$, $WO_x$ and $AgO_x$ where x is a positive number (or range of numbers) that can likewise vary per metal-oxygen material. In yet another embodiment(s), the active metal layer can comprise a metal oxygen-nitrogen selected from the group consisting of: $TiO_aN_b$, $AlO_aN_b$, $CuO_aN_b$, $WO_aN_b$ and $AgO_aN_b$, where a and b are suitable positive numbers/ranges of numbers. The disclosed filamentary resistive switching device can further comprise a switching layer comprising a switching material selected from the group consisting of: $SiO_y$, $AlN_y$, $TiO_y$, $TaO_y$, $AlO_y$, $CuO_y$, $TiN_x$, $TiN_y$, $TaN_x$, $TaN_y$, $SiO_x$, $SiN_y$, $AlN_x$, $CuN_x$, $CuN_y$, $AgN_x$, $AgN_y$, $TiO_x$, $TaO_x$, $AlO_x$, $CuO_x$, $AgO_x$, and $AgO_y$, where x and y are positive numbers (or ranges), and y is larger than x. Various combinations of the above are envisioned and contemplated within the scope of embodiments of the present invention.

In one example, a disclosed filamentary resistive switching device comprises a particle donor layer (e.g., the active metal-containing layer) comprising a stoichiometric or non-stoichiometric metal compound (or mixture) and a resistive switching layer. In one alternative embodiment of this example, the particle donor layer comprises a metal-nitrogen: $MN_x$, e.g., $AgN_x$, $TiN_x$, $AlN_x$, etc., and the resistive switching layer comprises a metal-nitrogen: $MN_y$, e.g., $AgO_y$, $TiO_y$, $AlO_y$, and so forth, where y and x are positive numbers (or ranges), and in some cases y is larger than x. In an alternative embodiment of this example, the particle donor layer comprises a metal-oxygen: $MO_x$, e.g., $AgO_x$, $TiO_x$, $AlO_x$, and so on, and the resistive switching layer comprises a metal-oxygen: $MO_y$, e.g., $AgO_y$, $TiO_y$, $AlO_y$, or the like, where y and x are positive numbers (or ranges), and in some cases y is larger than x. In yet another alternative, the metal compound of the particle donor layer is a $MN_x$ (e.g., $AgN_x$, $TiN_x$, $AlN_x$, etc.), and the resistive switching layer is selected from a group consisting of $MO_y$ (e.g., $AgO_y$, $TiO_y$, $AlO_y$, etc.) and $SiO_y$, where x and y are typically non-stoichiometric values, or vice versa in a still further embodiment.

As utilized herein, variables x, y, a, b, and so forth representative of values or ratios of one element with respect to another (or others) in a compound or mixture can have different values (or ranges) suitable for respective compounds/mixtures, and are not intended to denote a same or similar value or ratio among the compounds. Mixtures can refer to non-stoichiometric materials with free elements therein—such as metal-rich nitride or oxide (metal-oxide/nitride with free metal atoms), metal-poor nitride or oxide (metal-oxide/nitride with free oxygen/nitrogen atoms)—as well as other combinations of elements that do not form traditional stoichiometric compounds as understood in the art. Some details pertaining to embodiments of the subject disclosure can be found in the following U.S. patent applications that are licensed to the assignee of the present application for patent: Application Ser. No. 11/875,541 filed Oct. 19, 2007 and application Ser. No. 12/575,921 filed Oct. 8, 2009; each of the foregoing patent applications are hereby incorporated by reference herein in their respective entireties and for all purposes in addition to those incorporated by reference elsewhere herein.

It should be appreciated that various embodiments herein may utilize a variety of memory cell technologies, having different physical properties to generate PUF data, or random number generation (RNG) data. Physical properties suitable to non-correlated data can be associated with a fabrication process or processes, and can have stochastic or substantially stochastic characteristics that mitigate or avoid replication or repetition among fabricated memory cells, even when made by the same process. As one example, one or more layers of a disclosed resistive switching device can have a root mean square (RMS) surface roughness of >0.2 nm, up to a maximum of about 10.0 nm surface roughness, in an embodiment, or any suitable value or range there between in other embodiments (e.g., 0.4 nm-8 nm; 0.8 nm-6 nm; 1 nm-5 nm, and so forth). This results in random or near-random variation in layer thickness, including unpredictable changes in physical characteristics of such devices. In some theoretical models the RMS surface roughness can affect the geometry of a resistive switching material layer inducing stochastic or substantially stochastic variations in resistive switching devices properties such as: native or virgin (e.g., as fabricated) current conductance, program voltage, differential program voltage, program speed, differential program speed, among others disclosed throughout this specification. As further examples, different resistive-switching memory cells and cell technologies can have different discrete programmable resistances, different associated program/erase voltages, as well as other differentiating characteristics. In an embodiment, a resistive switching memory device resulting from a 28 nm photolithographic process with device size between about 50 nanometer (nm) width and about 130 nm width (e.g., about 100 nm width, about 56 nm width, about 75 nm width, about 128 nm width, and so forth) can be suitable to achieve stochastic physical characteristics disclosed herein. In other embodiments, a 22 nm photolithographic process producing a device size between 40 nm and 100 nm width (e.g., about 44 nm width, about 60 nm width, about 66 nm width, about 88 nm width, and so forth) can achieve stochastic physical characteristics.

Upon fabrication, disclosed resistive-switching devices can have native physical features generated from the fabrication process utilized to produce the resistive switching devices. These native physical features can have inherent stochastic or substantially stochastic properties that vary from resistive switching device to resistive switching device in a group of such devices, and can vary among devices in a die and among devices on a wafer or multiple wafers. As a result, minimal correlation in the native physical features among resistive switching devices within an array of such devices, among dies, among wafers and so forth, can yield minimal correlation between operational processes and data derived from such processes among devices, dies, wafers and so on. For instance, a native electrical resistance of a resistive switching layer (RSL) can depend at least in part on these non-correlated physical features and can vary from device to device even for adjacent devices in a single array on a single die (and, as previously stated, among multiple dies, wafers, and so on). Further, a current flow through the RSL in a native un-programmed state, a program voltage in the native un-programmed state, a program speed in the native un-programmed state, differential program voltage/current/speed in the native un-programmed state, and so on, can vary among resistive switching devices. Processes disclosed herein for forming resistive switching devices and for leveraging stochastic or substantially stochastic physically unclonable features of resistive switching devices can provide excellent non-correlated data sequences.

As utilized herein, the term "native", "original", "virgin" or the like refers to post-fabrication but pre-commercial operation of resistive switching devices on a semiconductor die. Native (and like terminology) can, in various embodiments, include some or all post-fabrication operations such as quality testing or other verification routines performed by a manufacturer, and even some pre-commercial operation by a non-manufacturer such as testing to ensure manufacturer quality specifications are met by a chip, chip setup routines or configuration routines (e.g., defining one-time programmable memory or identifier memory within an array of resistive switching memory; see e.g., FIGS. 1 and 2, infra), among others. In general, a resistive switching device is in a native state, as utilized herein, if it has not yet received a stimulus (e.g., electrical, thermal, magnetic, or a like stimulus known in the art, suitable combinations thereof, and so forth) suitable to form a conductive filament within the resistive switching device and change the resistive switching device from an electrically resistive state to an electrically conductive state as described herein or known in the art.

Some embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing) in response to electrical signals having the same polarity and different magnitudes.

In various embodiments, filamentary-based resistance switching devices can operate in a bipolar fashion, behaving differently in response to different polarity (or direction, energy flow, energy source orientation, etc.) external stimuli. For the volatile filamentary-based selector device, as an illustrative example, in response to a first polarity stimulus exceeding a first threshold voltage (or set of voltages), the filamentary selector device can change to a second resistance state from a first resistance state. Moreover, in response to a second polarity stimulus exceeding a second threshold voltage(s), the filamentary selector device can change to a third state from the first state. In some embodiments, the third state can be substantially the same as the first state, having the same or similar measurably distinct characteristic (e.g., electrical conductivity, and so forth), having the same or similar magnitude of threshold stimulus (though of opposite polarity or direction), or the like. In other embodiments, the third state can be distinct from the second state, either in terms of the measurable characteristic (e.g., different electrical conductivity value in response to the reverse polarity as compared to the forward polarity) or in terms of threshold stimulus associated with transitioning out of the first state (e.g., a different magnitude of positive voltage required to transition to the second state, compared to a magnitude of negative voltage required to transition to the third state).

For bipolar operation of a non-volatile filamentary-based memory cell, a conductive path or a filament forms through a non-volatile RSL in response to a suitable program voltage applied across the memory cell. In particular, upon application of a programming voltage, metallic ions are generated from the active metal-containing layer and migrate into the non-volatile RSL layer. The metallic ions can occupy voids or defect sites within the non-volatile RSL layer. In some embodiments, upon removal of the bias voltage, the metallic ions become neutral metal particles and remain trapped in voids or defects of the non-volatile RSL layer. When sufficient particles become trapped, a filament is formed and the memory cell switches from a relatively high resistive state, to a relatively low resistive state.

Once a conductive filament is formed, trapped conductive particles provide the conductive path or filament through the non-volatile RSL layer, and the resistance is typically determined by a tunneling resistance between one or more such particles and an electrical conductive material adjacent to the non-volatile RSL layer. In some resistive-switching devices, an erase process can be implemented to deform the conductive filament, at least in part, causing the memory cell to return to the high resistive state from the low resistive state. More specifically, upon application of an erase bias voltage, the metallic particles trapped in voids or defects of the non-volatile RSL become mobile ions and migrate back towards the active metal layer, or disassociate within the RSL (or a combination of the foregoing) to break electrical conductivity of the conductive filament through the RSL layer. This change of state, in the context of memory, can be associated with respective states of a binary bit. For an array of multiple memory cells, a word(s), byte(s), page(s), block(s), etc., of memory cells can be programmed or erased to represent zeroes or ones of binary information, and by retaining those states over time in effect storing the binary information. In various embodiments, multi-level information (e.g., multiple bits) may be stored in such memory cells.

By mapping digital information to non-volatile resistance states of a two-terminal memory cell, digital information can be stored at such device. Still further, by mapping digital information to process results applied to groups of two-terminal memory cells, PUF data or RNG data can be provided that leverage stochastic physical characteristics of the two-terminal resistive switching memory cells. An electronic device containing many of these two-terminal memory cells can receive external host commands specifying (or implying) a type of operation in conjunction with an address and optionally data for the command. The electronic device can decode the host command, identify the address and the type of operation, characterize two-terminal resistive switching memory cells located at the address for the type of operation, and implement the type of operation on the two-terminal resistive switching memory cells in response to the host command.

As utilized herein, the term "substantially" and other relative terms or terms of degree (e.g., about, approximately, substantially, and so forth) are intended to have the meaning specified explicitly in conjunction with their use herein, or a meaning which can be reasonably inferred by one ordinary skill in the art, or a reasonable variation of a specified quality(ies) or quantity(ies) that would be understood by one of ordinary skill in the art by reference to this entire specification (including the knowledge of one of ordinary skill in the art as well as material incorporated by reference herein). As an example, a term of degree could refer to reasonable manufacturing tolerances about which a specified quality or quantity could be realized with fabrication equipment. Thus, as a specific illustration, though non-limiting, for an element of a resistive switching device expressly identified as having a dimension of about 50 angstroms (Å), the relative term "about" can mean reasonable variances about 50 Å that one of ordinary skill in the art would anticipate the specified dimension of the element could be realized with commercial fabrication equipment, industrial fabrication equipment, laboratory fabrication equipment, or the like, and is not limited to a mathematically precise quantity (or quality). In other examples, a term of degree could mean a variance of +/−0-3%, +/−0-5%, or +/−0-10% of an expressly stated value, where suitable to one of ordinary skill in the art to achieve a stated function or feature of an element disclosed herein. In still other examples, a term of degree could mean any suitable variance in quality(ies) or quantity(ies) that would be suitable to accomplish one or more explicitly disclosed function(s) or feature(s) of a disclosed element. Accordingly, the subject specification is by no means limited only to specific qualities and quantities disclosed herein, but includes all variations of specified quality(ies) or quantity(ies) reasonably conveyed to one of ordinary skill in the art by way of the context disclosed herein.

Overview

FIG. 1 illustrates a block diagram of an example integrated circuit device 100 for an electronic device according to one or more embodiments of the present disclosure. Integrated circuit device 100 includes an array(s) of memory 105. Array(s) of memory 105 can include two-terminal resistive switching devices 110, characterized by integrated circuit device 100 to operate as identifier memory 112 and one-time programmable (OTP) memory 130, among other operation characterizations (e.g., MTP memory, RNG devices, etc.). Two-terminal resistive switching devices can also be referred to herein as resistive switching devices (e.g., volatile devices, non-volatile devices), resistive switching cells, resistive switching memory devices, two-terminal memory devices, and similar descriptions. In various embodiments, resistive switching devices 110 can include non-volatile two-terminal resistive-switching memory devices, volatile two-terminal resistive-switching devices, or a combination of non-volatile two-terminal resistive-switching memory devices and volatile two-terminal resistive-switching devices (where the latter e.g., serves as a selector device for a non-volatile memory, or operates independently as a volatile latch, switch, or the like). In some embodiments, array(s) of memory 105 can include other memory cell technologies, such as phase change memory, oxygen vacancy memory cells, magnetic memory, conductive bridge memory, and so forth.

Identifier memory 112 as utilized herein can refer to memory utilized to store or operate in a fashion to generate uncorrelated data, generally understood to be suitable for distinguishing one set of identifier data from another set of identifier data, and respective devices associated with that data. Specific examples of identifier memory 112 can include resistive switching cells characterized to operate as PUF memory, RNG memory, or the like. Other disclosed embodiments disclose an array(s) of resistive switching memory characterized with OTP memory, MTP memory, RNG memory in addition to identifier memory, sometimes specifically identified as a PUF memory (e.g., see FIGS. 2 and 7-8, infra, among others).

Identifier memory 112 and OTP memory 130 can be separate memory structures from array(s) of memory 105 (e.g., located externally to array(s) of memory 105 on a semiconductor chip) or can be at least in part included within array(s) of memory 105 (e.g., an array among a set of arrays that embody array(s) of memory 105, a block of memory within such an array(s), a set of pages within one or more blocks or arrays, or other suitable arrangement). In one embodiment(s), identifier memory 112 and OTP memory 130 can have a fixed size or number of memory cells located within a group of addresses of array(s) of memory 105 pre-assigned to one operational characteristic (e.g., MTP operation, OTP operation, RNG operation, PUF operation, or the like; see, e.g., FIG. 4, infra). In such embodiments, a host command received by controller 120 identifying addresses of target memory cells can be operated upon according to the pre-assigned operational characteristic associated with those addresses.

In other embodiments, some or all of array(s) of memory 105 can be dynamically characterized as one operational type of a set of available operational types, post-fabrication. For instance, controller 120 can dynamically characterize a set of memory cells identified in a host command as MTP memory, OTP memory, RNG memory or PUF memory, in response to the host command. Trim instructions can be referenced by controller 120 to implement protocols necessary to execute the operations associated with the characterization of the memory cells (e.g., see FIG. 2, infra). In some disclosed embodiments, the host command can include data distinguishing a selected operational characterization from a set of operational characterizations. In other disclosed embodiments, the host command can be accompanied by selection of a pin setting (e.g., a hi/low pin setting) associated by controller 120 with the selected operational characterization. The selected pin setting can be, for instance, a member of a set of pin settings respectively associated with different operational characterizations of the set of operational characterizations, with the selected pin setting associated with the selected operational characterization (e.g., see FIG. 5). As introduced previously, in alternative embodiments and with some additional detail: controller 120 can infer an operational characterization for the set of memory cells from addresses of the memory cells (e.g., identifying or implying their location within array(s) of memory 105) specified in the host command, and a stored association of the addresses with the operational characterization.

Also illustrated in integrated circuit device 100 is an input(s) 140 and output(s) 150. In some embodiment, input(s) 140 can include (or provide a pathway for) data to be stored within resistive switching devices 110, identifier memory 112 or OTP memory 130. Output(s) 150 can output data stored within resistive switching devices 110, identifier memory 112 or OTP memory 130. In some embodiments, output(s) 150 can output data that results from computations utilizing data stored in identifier memory 112, or stored within resistive switching devices 110 or OTP memory 130 resulting from such computations, in further embodiments.

In addition to the foregoing, disclosed resistive switching devices have excellent properties for generating identifier data sequences. Such properties include high entropy, which is suitable for generating random or substantially random numbers, low BER, inherent difficulty in reverse engineering or illicit side-channel data access, and fast sensing times. For example, a bit sequence of 128 or 256 identifier (e.g., PUF) bits can be formed from 128 or 256 resistive switching devices (as described herein) or 128/256 groups of multiple such resistive switching devices (as described in differential identifier bit generation; see FIGS. 6-8, infra). High randomness in generating identifier bits minimizes non-random patterns between bits (resistive switching devices/groups of such devices) of a sequence, mitigating or avoiding false rejection rates. In addition, high randomness enhances security margin by minimizing hamming distance values for multiple read operations of an identifier sequence on a single die and providing an ideal gaussian distribution of hamming distance values among multiple dies of resistive switching devices. This can increase a total number of semiconductor chips that can achieve distinct identifier sequences for a given sequence bit count, even with high security margin (e.g., defined by a number of distinct bits differentiating different PUF sequences).

In one or more embodiments, controller 120 can be operable to perform memory operations on array(s) of memory 105. For instance, controller 120 can be operable to perform sensing operations pertaining to generating an identifier data bit from one (or a group of) resistive switching device(s) operably characterized as identifier memory cells 112, in an embodiment(s). Examples of sensing operations pertaining to generating an identifier bit can include: native current of a never-programmed resistive switching device in the context of PUF data (or leak current of an un-programmed device in the context of RNG data) in response to a sub-program voltage, native electrical resistance of a resistive switching device, detection of program events, detection of speed or timing of program events, a program voltage, a program current, an on-state (programmed) resistance, an erase voltage or current, a delay frequency, a parasitic resistance or capacitance, a program or erase minimum pulse width, and so forth, or suitable combinations of the foregoing, as described herein (or as described within U.S. application Ser. No. 17/223,817 incorporated by reference hereinabove). In general, however, these sensing operations can be digitized to generate PUF or RNG data by comparing a measured result of a sensing operation (native current in response to sub-program voltage, detection of program event in response to a program signal, speed or timing of program event, a voltage at which a device becomes programmed, and so forth) to a threshold value stored in trim settings (e.g., trims 222 of FIG. 2, infra) of controller 120. Generation of PUF data usually involves never-programmed resistive switching memory cells, whereas generation of RNG data can involve never-programmed cells, or un-programmed cells with relatively low program counts (e.g., fewer than 10 program events; fewer than 50 program events; fewer than 100 program events; fewer than 1000 program events; or other suitable value, or any suitable value or range there between).

As further examples, controller 120 can be operable to perform a program operation(s) pertaining to generating an identifier data bit utilizing an identifier memory cell(s) 112 of array(s) of memory 105. Examples of such program operations include: applying a program voltage magnitude to a never-programmed (or un-programmed for RNG data) memory cell and determining whether the cell is programmed or not programmed in response to the selected program voltage magnitude (program voltage magnitude differentiation). The identifier data bit can be digitized by assigning a '1' if the cell is programmed, and '0' if not programmed (or vice versa). Further examples include: applying a program signal of selected pulse duration to a never-programmed (or un-programmed) memory cell and determining whether the cell is programmed or not programmed after the selected pulse duration (program time differentiation). Similar to the previous example, the identifier data bit can be digitized by assigning a '1' if the cell is programmed, and '0' if not programmed (or vice versa). Another example includes: applying a sub-program voltage to a never-programmed (or un-programmed) memory cell and determining whether a native (or leak) non-programmed current is above or below a preselected current threshold (native/leak current differentiation). The identifier bit can be digitized by assigning a '1' if native current is above the threshold and assigning a '0' if native current is below the threshold (or vice versa). Other examples or combinations of the foregoing known in the art or reasonably suggested to one of ordinary skill in the art by way of the context provided herein are considered within the scope of the present disclosure.

In still other embodiments, controller 120 can be configured to implement differential operations pertaining to generating an identifier bit from a plurality of resistive switching devices. Generally, differential operations compare response of one or more cells of a plurality of memory cells to a memory operation and digitize an identifier bit associated with the plurality of memory cells based on relative responses of the one or more memory cells. Differential operations usable to generate an identifier according to aspects of the present disclosure can include: differential program speed of a group of never (or un) programmed memory cells, differential native program voltage of the group of memory cells, differential native (leak) current of the group of memory cells, differential native electrical resistance of the group of memory cells, differential on-state resistance of the group of memory cells, differential erase voltage or current of the group of memory cells, differential delay frequency of the group of memory cells, differential parasitic resistance or capacitance of the group of memory cells, a differential program or erase minimum pulse width or duration of the group of memory cells, or the like, or a suitable combination of the foregoing. For differential operations, using the exemplary case of two cells per identifier bit (though the rule can be extended to three or more cells per identifier bit through proportional logic, optionally for generating multi-bit identifier data with suitable numbers of differential cells), the identifier bit can be digitized by assigning a '0' value to identifier bits in which a first memory cell has higher (or lower) native current/on-state resistance/erase voltage/delay frequency/parasitic resistance or capacitance/program or erase speed, etc., and assigning a '1' to identifier bits in which a second memory cell has the higher (or lower) native current/on-state resistance/erase voltage/delay frequency/parasitic resistance or capacitance/program or erase speed, and so forth. Rules for digitizing identifier bits utilizing differential operations on multiple memory cells can be stored in trims 222, in an embodiment (see, e.g., FIG. 2, infra) or elsewhere in controller 120 or integrated circuit device 100.

In yet other embodiments, controller 120 can be operable to selectively implement one-time programmable operations on selected identifier memory cells 112 to render permanent an identifier bit sequence generated with a program event at a set of identifier memory cells 112 (or, e.g., stored at a set of memory cells in response to generation at other memory cells by a non-program event, such as native leak current or the like). Described differently, a PUF data sequence comprising program and un-programmed bits can be reinforced with a strong program pulse, e.g., a one-time programmable pulse, to make program bits of the PUF data sequence non-erasable and create large sensing margin between the program bits and the un-programmed bits of the PUF data sequence. This can serve to greatly enhance longevity and accurate read cycle counts of the identifier bit sequence.

In still additional embodiments, controller 120 can be operable to establish one or more threshold metric levels (e.g., current level(s), resistance level(s), program voltage level(s), program speed level(s), etc.) for defining identifier bit values (e.g., logic levels; a '0' bit and a '1' bit in the binary context) from sensing operations or program operations performed on identifier memory cells 112, as described herein. As an illustrative example, if an operational characteristic selected to generate identifier bit data is a native leak current, a current value threshold (or small range of values) (e.g., 500 nA, or any other suitable value or range) can be selected and resistive switching devices above the current value threshold can be allocated a '1' identifier bit value and devices below the current value threshold can be allocated a '0' identifier bit value. In other embodiments, a range of threshold values with a lower threshold and an upper threshold (e.g., a lower threshold of 400 nA and an upper threshold of 600 nA, or any other suitable threshold value or range of values) can be utilized. Devices with native current below 400 nA can be allocated a 'O' identifier bit value; devices with native current above 600 nA can be allocated a '1' identifier bit value, and devices between 400 nA and 600 nA can be discarded, in an embodiment. In an embodiment, further read operations can use a 500 nA threshold to regenerate the '0' bit values and '1' bit values. Using lower and higher initial threshold values can increase sensing margin and reduce bit error rates, according to embodiments of the present disclosure.

It should be appreciated that a suitable threshold or set of thresholds can be established for other resistive switching device operational characteristics selected for generating identifier bits information. As another (non-limited) illustrative example, a logic level 0 can be associated with a program voltage of 2 volts or higher and a logic level 1 associated with a program voltage of 1.8 volts or below. As stated previously, other suitable thresholds can be used to define logic level values for identifier bits as disclosed herein. In some embodiments, when a large number of resistive switching devices are sensed as part of generating identifier bits, a threshold voltage, current, pulse width etc., can be selected such that approximately half of the devices become associated with a logic level 0 and another half become associated with a logic level 1. In some embodiments, threshold settings can be performed manually by way of controller 120; in other embodiments default threshold settings can be set (optionally stored in trims 222 of FIG. 2) upon initializing a semiconductor chip.

In further embodiments, a sensing operation or program event utilized to generate a PUF bit sequence can be selected such that disclosed resistive switching memory cells could have the same or substantially the same measurement over time in response to the sensing operation/program event, over many read cycles and at a range of temperatures common to semiconductor chips. This leads to very low bit error rate for disclosed identifier bit sequences. As an illustrative example, a native leak current (or other physical unclonable characteristic) for a resistive switching device measured for the first time on day 1 at room temperature can measure the same or substantially the same (e.g., relative to a constant native leak current threshold) years later, at 100 degrees C. after a million read operations. Values of the resistance switching device can be determined upon demand by controller 120. As another illustrative example, to determine an electrical resistance of a resistive switching device, a current source can be applied to the resistive switching device, a voltage drop measured and resistance calculated. Other techniques for measuring or determining physical characteristics of resistive switching devices known in the art or reasonably conveyed to one of ordinary skill in the art are considered within the scope of the present disclosure.

In addition to the foregoing, controller 120 can be configured to define an arrangement or ordering of resistive switching devices (or groups of resistive switching devices) to create a multi-bit sequence of identifier bits. As one illustrative example, resistive switching devices 0:7 can be read and assigned to bits 0:7 of a bit sequence. In other embodiments, the bit sequence need not be derived from resistive switching devices arrayed in a particular order. As an example, from an ordinal line of resistive switching devices, devices 15, 90, 7, 21, 50, 2, 37, 19 can be read and respectively assigned to bits 0:7 of an output bit string. The bit string can be of any selected length. For instance, bit strings of 64 bits, 256 bits, 1024 bits, 64 kbits, or any other suitable subset of identifier memory cells 112 up to all of identifier memory cells 112 (which can include all of array(s) of memory 105 in at least some embodiments) may be employed for a bit string. As another non-limiting illustration, for a 256-bit PUF data sequence utilized for a cryptographic key, controller 120 can characterize a set of memory cells as PUF bits and define an ordering of resistive switching memory cells assigned to the PUF bits to correspond with a sequence of 256 bits. Bit values (e.g., logic levels, . . . ) generated from the assigned resistive switching memory cells can then be ordered by controller 120 consistent with the device(s) ordering to thereby create the 256-bit identifier sequence. As a specific illustration: where a row of 256 resistive switching devices in an array is selected for generating an identifier sequence, identifier bit values of the 256 resistive switching devices can be arranged in the order the resistive switching devices are physically situated in the row; however, this is an illustrative example only and any other suitable arrangement or ordering can be implemented by controller 120 as an alternative or in addition.

As is evident from the disclosure as a whole, any suitable number of bits of array(s) of memory 105 can be operationally characterized as PUF bits, RNG bits, OTP or MTP bits, and so forth. Further, controller 120 can operationally characterize such bits in response to a host command identifying addresses of target bits and specifying an associated operation to implement on the target bits. Where the operation is a PUF write operation for defining a cryptographic key, controller 120 can be operable to characterize the target bits as PUF bits, optionally assign differential memory cells from resistive switching device 110 to the target bits for differential PUF operation, implement the PUF write and define an order to aggregate 256 bits of data generated from the PUF write as the cryptographic key. In one or more embodiments, controller 120 can implement methods 900-1300 of FIGS. 9-13 on array(s) of memory 105.

In one or more additional embodiments, controller 120 can be operable to characterize resistive switching devices of array(s) of memory 105 as MTP memory cells (e.g., resistive switching devices 110) or OTP memory cells 114, and to store data in MTP memory cells 110 or OTP memory cells 114. Controller 120 can receive an input data word from input(s) 140 to be stored, as an example. In some embodiments, controller 120 can combine the input data word with an identifier data sequence stored at/generated at identifier/PUF memory cells 112 to generate an output data word. This output data word can be stored in MTP memory cells 110, in an embodiment. The input word can optionally be deleted. Subsequently, to recreate the input data, the output data word stored in MTP memory cells 110 can be combined with the identifier data sequence (optionally computed on-the-fly by controller 120), and the recreated input data word can be output via output(s) 150. In various embodiments, such an input data word can be a password, a document, a cryptographic key, or any other suitable data to be stored securely.

Figure 2:
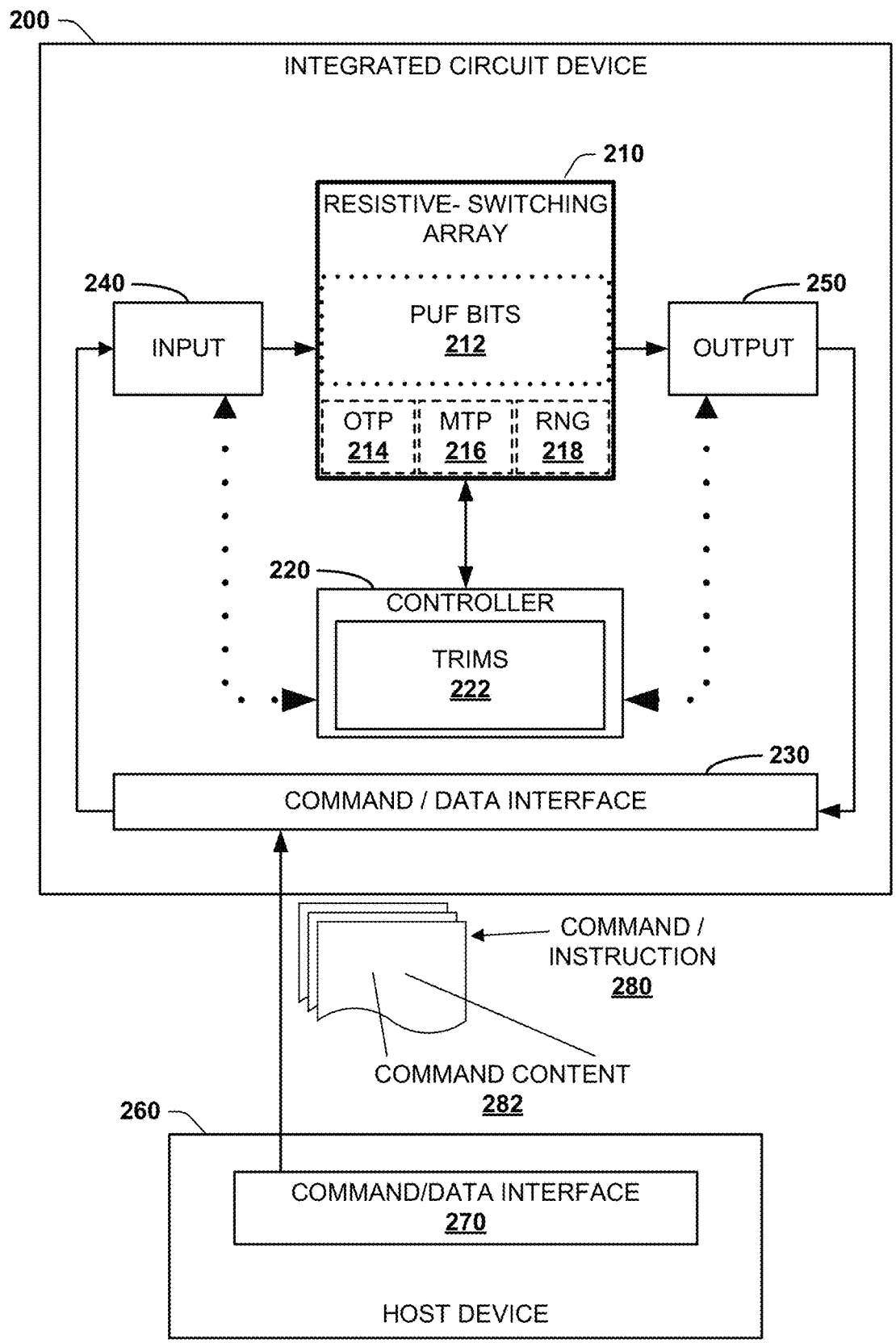
FIG. 2 illustrates a block diagram of an example IC device that characterizes operation of subsets of RS devices in a RS array in response to an external host command.
Figure 3:
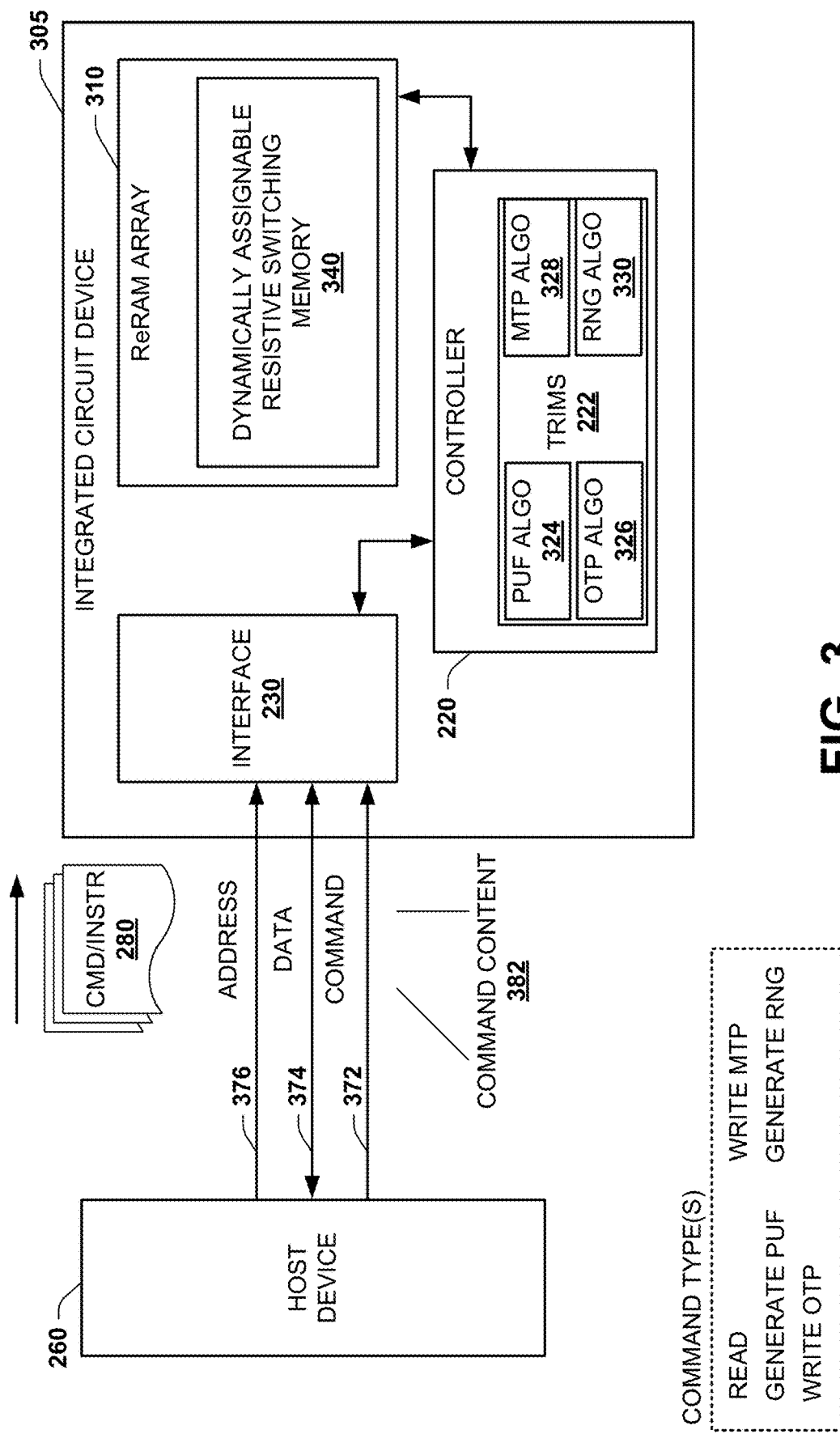
FIG. 3 depicts a block diagram of a sample IC device enabling an external host device to operationally characters subsets of RS devices in a RS array; in further embodiments.
Figure 4:
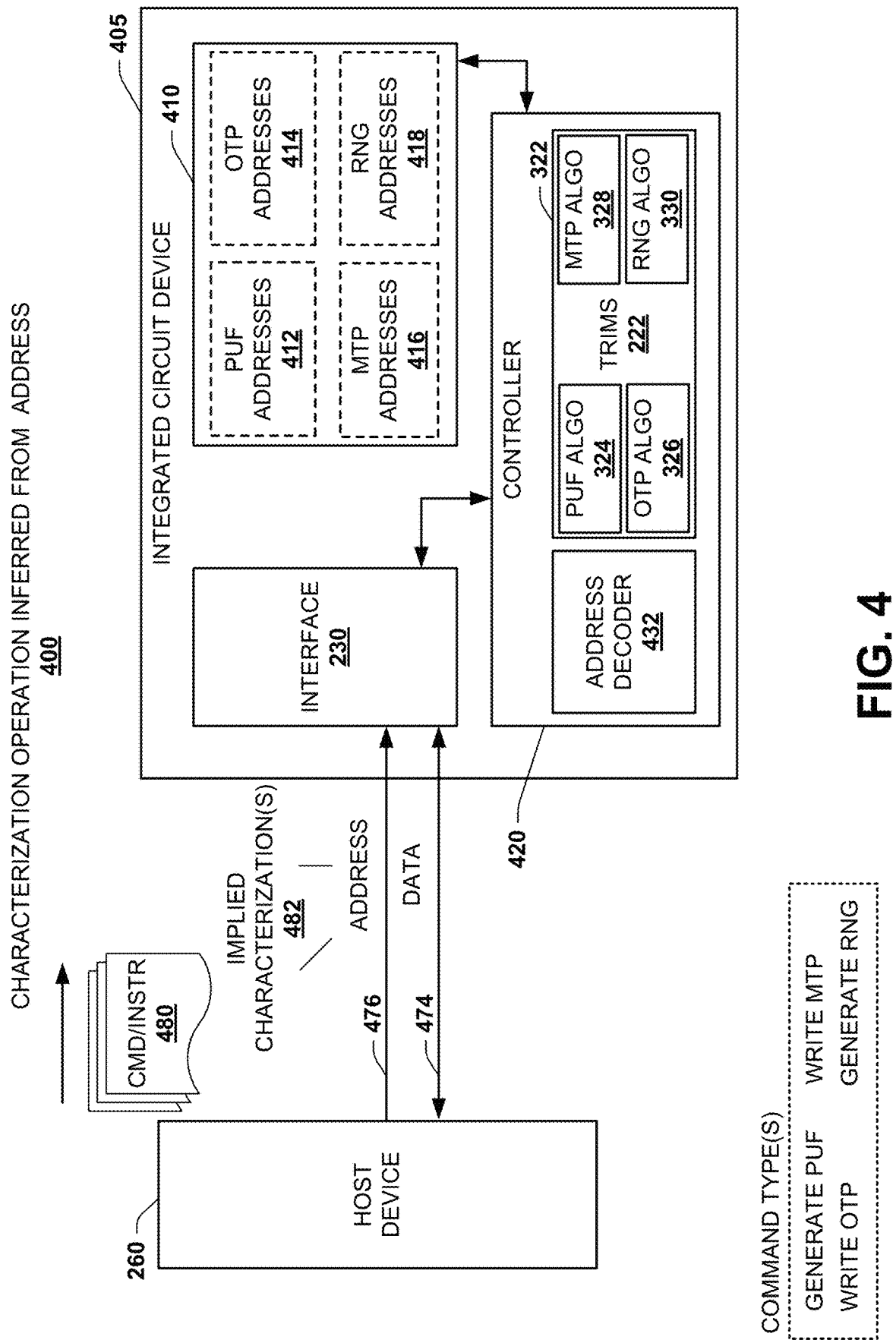
FIG. 4 illustrates a block diagram of a sample IC device having pre-assigned operational characteristics assigned to groups of addresses in the RS array, in an embodiment(s)
Figure 5:
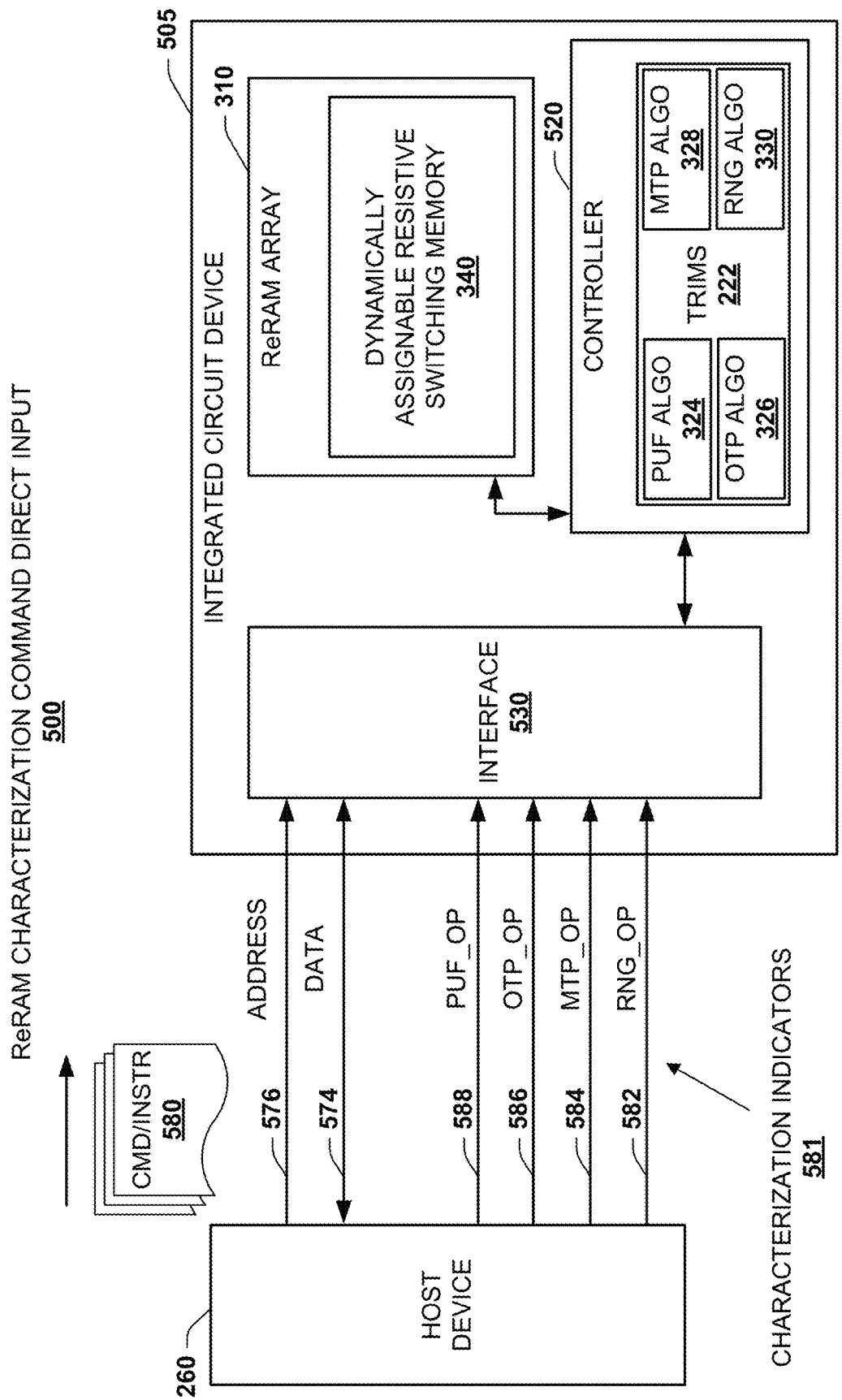
FIG. 5 illustrates a block diagram of a sample RS memory device with operational characterization settable by an external host device, in further embodiments.

In should be understood that operations, configurations, characteristics and various illustrations and descriptions of controller 120 can be applicable to other controllers disclosed herein in various embodiments (e.g., controller 220 of FIGS. 2 and 3, controller 420 of FIG. 4, controller 520 of FIG. 5). Conversely, operations, configurations, characteristics and various illustrations and descriptions of other controllers disclosed herein can be applicable to controller 120 in one or more embodiments.

Referring now to FIG. 2, there is depicted an integrated circuit device 200 that provides a novel mechanism for exporting control over PUF data generated from resistive switching memory cells located on integrated circuit device 200 to a host device 260 external to the integrated circuit device 200. PUF data generated from resistive switching memory cells (e.g., included within resistive-switching array 210) is anticipated to have better randomness and enhanced longevity, among other features, than other mechanisms for generating PUF data. For example, use of static random access memory (SRAM) for generating identifier sequence data has met with fairly high bit error rate (BER), from 3% to 15% depending on implementation. To reduce BER associated with SRAM identifier sequence generation, complicated circuitry is coupled to the SRAM bits upon fabrication. This permanently fixes the SRAM bits that can be utilized for identifier sequence generation at manufacture, and further adds significant hardware overhead to a semiconductor die. Disclosed resistive switching devices can generate identifier sequence data with extremely low BER (e.g., see FIG. 7 of U.S. patent application Ser. No. 17/223,816 filed Apr. 6, 2021, incorporated by reference hereinabove), avoiding special BER-reducing circuitry permanently affixed to specific memory cells as is utilized in the SRAM context. As a result, embodiments disclosed herein can utilize row and column selection circuitry (including multiplexers) and processes associated with implementing read, write, erase and other memory operations on resistive switching devices (e.g., see FIGS. 14 and 15, infra), and extend those circuitry and processes to generating or storing PUF data, RNG data, OTP data, MTP data, and so forth. In such embodiments, resistive switching devices utilized for MTP memory operations, identifier data or OTP storage need not be fixed on manufacture, and instead can be dynamically exposed for selection and re-configuration post-fabrication (e.g., by way of controller 220). In at least some embodiments, that selection and re-configuration can be exported to external host device 260, which is separate from integrated circuit device 200. In various example implementations, integrated circuit device 200 and host device 260 can be manufactured separately and interconnected by one or more network or device interfaces, such as command/data interface 230 and command/data interface 270, among others.

Integrated circuit device 200 can comprise a resistive-switching array 210 comprising an array (or multiple arrays) of resistive-switching devices. In an embodiment, resistive-switching array 210 can include non-volatile resistive switching memory devices. In another embodiment, resistive-switching array 210 can include volatile resistive switching devices (e.g., selectors, switches, latches, and so forth). In still other embodiments, resistive-switching array 210 can include a portion comprising non-volatile resistive switching memory devices and a second portion comprising volatile resistive switching devices. In at least one embodiment, resistive-switching array 210 can comprise memory cells that respectively include an electrical series combination of a non-volatile resistive switching device and a volatile resistive switching device. Resistive-switching array 210 can comprise portions having combinations of the foregoing, in one or more embodiments.

Resistive-switching array 210 illustrates portions of resistive switching devices of different operational characterizations: PUF bits 212, OTP bits 214, MTP bits 216 and RNG bits 218. It should be understood that no spatial orientation, relative or absolute, is implied by the position of the dotted blocks within resistive-switching array 210 (or like illustrations in other Figures), and furthermore some or all of the resistive switching devices of resistive-switching array 210 can be operationally uncharacterized upon manufacture. Further, some or all resistive switching devices can be changed from one operational characterization to a different operational characterization, or from an operational characterization to no operational characterization by controller 220 (effectively making some or all of the resistive switching devices a default characterization, e.g., MTP).

Rules for establishing a subset of switching devices of resistive-switching array 210 according to a disclosed operational characterization can be stored in trim settings 222 (also referred to herein as trims). Trim settings 222 can comprise rules for storing operational characterizations of the characterized subsets of resistive-switching array 210, rules for identifying memory cell addresses having one of the specified characterizations, rules for performing operations upon characterized switching devices consistent with the characterization, and so forth. For instance, trims 222 can store rules for characterizing one or more groups of resistive switching devices of resistive switching-array 210 as PUF bits 212, rules for coupling multiple resistive switching devices to form differential PUF bits in some embodiments (e.g., see FIGS. 6-8, infra), rules for performing a PUF operation on a group of resistive switching devices characterized as PUF bits 212, such as a PUF write (to generate PUF bits) or a PUF read (to read data generated with a PUF write and stored at cells generating the data, stored at a subset of the cells generating the data, or stored at other cells within resistive-switching array 210, according to various embodiments), and rules for re-characterizing resistive switching devices as OTP bits 214, MTP bits 216 or RNG bits 218 previously characterized as PUF bits 212, or as no characterization. Trim settings 222 can likewise store rules for characterizing one or more groups of resistive switching devices as OTP bits 214, MTP bits 216 or RNG bits 218, rules for coupling multiple resistive switching devices to form differential RNG bits (e.g., in a similar manner as provided herein for differential PUF bits, extended to un-programmed memory cells with low write counts), rules for performing an OTP, MTP or RNG operation, and rules for re-characterizing OTP bits 214, MTP bits 216 or RNG bits 218 as other characterizations, or no characterization (e.g., utilizing default or conventional trim instructions in at least one embodiment).

In further embodiments, controller 220 can be configured to operationally characterize one or more resistive memory devices of resistive-switching array 210 in response to a command/instruction 280 received from host device 260 over a command/data interface 230. Command/instruction 280 can include command content 282 facilitating operational characterization of the resistive memory device(s) by controller 220. In some embodiments, command/instruction 280 can include data identifying an address(es) of the resistive memory device(s) within resistive-switching array 210. Following receipt of command/instruction 280 at command/data interface 230, controller 220 can decode command/instruction 280, acquire the address(es) and identify the resistive switching device(s) having the address(es) within resistive-switching array 210. In alternative or additional embodiments, command/instruction 280 can include data implying an address(es) of the resistive memory device(s). These embodiments can be utilized where controller 220 maintains a virtual addressing arrangement that provides virtual addresses (or logical addresses) for resistive-switching array 220 utilized by host device 260 that are then translated to physical addresses at controller 220. In such case, host device 260 includes data indicative of the virtual address(es) of the resistive switching device(s) and controller 220 can translate the virtual address(es) to a physical address(es) (e.g., utilizing a virtual address map stored at integrated circuit device 200—not depicted) to explicitly identify the resistive switching device(s) at the physical address(es). Other mappings of logical or virtual addressing to physical addressing known in the art or reasonably conveyed to one of ordinary skill in the art by way of the context provided herein are considered within the scope of the present disclosure.

In addition to the foregoing, command content 282 of command/instruction 280 can identify or imply an operational characterization to be assigned to the resistive switching device(s) associated with the address(es) identified in command/instruction 280. In one embodiment, command content 282 can include data specifically identifying the operational characterization (e.g., OTP, MTP, RNG, PUF, etc.) to be applied to the resistive switching device(s) associated with the address(es). In other embodiments, command content 282 can include or accompany an explicit physical selection at command/data interface 230 identifying the operational characterization. In still other embodiments, the operational characterization can be inferred from other data included within command content 282 or provided with command content 282. As one example, in alternative or additional embodiments of the present disclosure, the address(es) can be mapped to an operational characterization stored at controller 220, and controller 220 can obtain the operational characterization by referencing the stored mapping and decoding the operational characterization associated with the address(es) stored therein. According to this example, command content 282 need not specify the operational characterization; instead, controller 220 can determine the operational characterization from the stored association with the address(es).

Command content 282 can include additional information to that specified above, in various embodiments. For instance, command content 282 can include data specifying a command to perform on the resistive switching device(s) associated with the address(es) included in command content 282. In an embodiment, the command can be any suitable memory operation for resistive switching devices. Such memory operation can include conventional operations such as read, write and erase operations for non-volatile rewritable memory cells. The memory operations can also include memory operations configured for an operational characterization specified herein. For example, a memory operation included in command content 282 can be: a PUF write, PUF read, OTP write, OTP read, RNG write, RNG read, or suitable erase or overwrite operations associated therewith, where appropriate. In some embodiments, the command is not explicitly specified, but inferred from an operational characterization included with (or implied by) command content 282. In various embodiments therefore, controller 220 can be operable to implement conventional memory operations on resistive-switching array 210, as well as operations configured according to operational characterizations described herein, in response to host command/instruction 280 provided by host device 260.

Once controller 220 decodes command/instruction 280 and obtains or infers the operational characterization and address(es) of memory cells of resistive-switching array 210, controller 220 can store the operational characterization in reference to those memory cells. Examples of the operational characterization can include PUF, RNG, OTP or MTP operational characterizations. In addition, associated operations can be implemented on the memory cells consistent with the operational characterization stored in trims settings 222. Thus, for instance, controller 220 can reference trim settings 222 to determine suitable signal characteristics for a memory operation configured for the particular operational characterization. Suitable signal characteristics can include: a voltage magnitude(s), current compliance, signal duration, dynamic voltage pulse as a function of time, and so forth. For a PUF write, for instance, trim settings 222 can store suitable signal characteristics for various PUF write modalities described herein (e.g., utilizing native current, native electrical resistance, detected program event(s), among others). As an illustrative example, trim settings 222 can store a suitable sub-program voltage magnitude (e.g., from one or more millivolts to one or more tenths of a volt, or any suitable value or range there between) to be utilized by controller 220 for measuring native current of a resistive switching device in conjunction with determining a value of an identifier bit (e.g., performing the PUF write) for that resistive switching device. Trim settings 222 can also store suitable inhibition signals for memory cells neighboring the resistive switching device, a termination condition(s) for terminating the sub-program voltage signal, among other signal operations employed for operating resistive switching devices. Likewise, trim settings 222 can store suitable signal characteristics, inhibit signal characteristics, termination conditions, and so forth, for other types of identifier bit sensing operations disclosed herein. Further, trim settings 222 can store rules for aggregating multiple memory cells to form a differential identifier bit, for differential PUF or RNG memory operation, and for aggregating groups of multiple memory cells to create multiple differential identifier bits to generate a sequence of PUF data or RNG data. Other operational rules, configurations, settings and the like can be stored in trim settings 222 as disclosed herein, as known in the art or as reasonably conveyed to one of ordinary skill in the art by way of the context presented herein.

Data received at command/data interface 230 can be written to resistive-switching array 210 by way of input 240 and controller 220. Likewise, data can be read from resistive-switching array 210 by way of output 250 and controller 220, and sent to host device 260 by way of command/data interface 230 and command/data interface 270. Moreover, controller can utilize input 240 or output 250 in conjunction with implementing memory operations according to a specific operational characterization stored in trim settings 222, in various embodiments. Further, the operational characterization and memory operations in accordance there with can be executed in response to command/instruction 280 received from host device 260, and on resistive switching devices identified from command content 282, according to various embodiments.

FIG. 3 illustrates a block diagram of a host communication with embedded configuration operation 300, according to one or more embodiments of the present disclosure. Host device 260 generates a command/instruction 280 provided to integrated circuit device 305 comprising a resistive switching device array (ReRAM array) 310. Command/instruction 280 includes command content 382 with a first set of data identifying memory cells of ReRAM array 310, and a second set of data identifying an operation to be performed on the memory cells. Third data can optionally be included to specify information to be stored at the memory cells. As illustrated, command content 382 can include the first data, such as an address(es) 376 of one or more switching devices of the ReRAM array 310, as well as second data specifying, for example, a memory command 372. Upon decoding command/instruction 280, controller 220 can acquire the first and second data (and third data), identify one or more switching devices specified by the first data and determine an operational characterization for the one or more switching devices (e.g., PUF characterization, RNG characterization, etc.), as well as a memory operation (e.g., PUF write, PUF read, RNG write, RNG read, and so forth) associated with the operational characterization from the second data. Data 374 may also be provided with command/instructions 280 for writing to the one or more switching devices, in the case of a write command, or may be read from the one or more switching devices and transmitted to host device 260, in the case of a read command. For PUF write and RNG write commands, data 374 can be all '1's, indicating program signals, sensing signals, differential program/sensing signals, and so forth, are applied to all target cells and PUF or RNG data is generated from results of those signals (e.g., based on comparison of a cell(s) to a threshold value(s), or relative result comparison of grouped cells in the case of a differential write).

ReRAM array 310 includes a dynamically assignable resistive switching memory array 340. Switching devices of dynamically assignable resistive switching memory array 340 can be operationally characterized (or recharacterized) by controller 220. Operational characterization can be individually asserted with different levels of granularity, in various embodiments. In some embodiments, blocks or pages of switching devices of array 340 can be operationally characterized. In other embodiments, words or bytes of switching devices of array 340 can be operationally characterized. In still other embodiments, bits or single devices (or, e.g., single groups of aggregated cells in the differential context) can be operationally characterized. In still other embodiments, any suitable combination of a bit(s), a byte(s), a word(s), a page(s) or a block(s) of resistive switching devices, or any other suitable nomenclature defining a plurality of memory cells of a resistive switching memory array, can be operationally characterized by controller 220. Thus, any group of switching devices identified by address data 376

Controller 220 includes trim settings 222 to store algorithms for properly operating upon memory cells consistent with their operational characterization. Thus, trim settings 222 can store PUF operation algorithms 324, OTP operation algorithms 326, MTP operation algorithms 328, and RNG operation algorithms 330, as suitable to implement the functions described herein or reasonably conveyed to those of skill in the art by way of the context provided herein, all of which are included within the scope of the present disclosure.

In response to identifying an operational command from second data 372, controller 220 can operationally characterize resistive switching devices identified by the first data 376. Once characterized, controller 220 can reference trim settings 222 for proper parameters and instructions for executing the operational command consistent (e.g., PUF write, PUF read, RNG write, RNG read, and so forth) with the operational characterization (e.g., PUF, RNG, OTP, MTP). Controller 220 then executes the operational command consistent with the trim settings 222. Third data 374 can be written to the resistive switching devices for a write operation. In the PUF and RNG context, third data 374 can consist of all '1's, indicating that PUF write or RNG write signals to generate PUF/RNG data should be applied to all resistive switching devices (or groups of differential devices) identified by first data 376. In the OTP and MTP context, third data 374 can comprise a set of data to be written to resistive switching devices identified by the first data 376. For a read command, data 374 can be read out from ReRAM array 310 and conveyed to host device 260.

FIG. 4 illustrates a block diagram of a host communication with inferred configuration operation 400, according to one or more embodiments of the present disclosure. Host device 260 generates a command/instruction 280 provided to integrated circuit device 405 comprising a resistive switching device array (ReRAM array) 410. Command/instruction 480 includes a first set of data 476 identifying resistive switching devices of ReRAM array 410 (e.g., through an address(es) associated with the resistive switching devices), and can include second data 474 within command/instruction 480 or receive second data 474 in response to command/instruction 480, as suitable. As examples, second data 474 can include data to be written to the resistive switching devices (e.g., in response to a write command) or received from the resistive switching devices (e.g., in response to a read command). In one or more embodiments, command/instruction 480 can also include third data specifying a command to be executed on the resistive switching devices where such command is not implied by an operational characterization associated with resistive switching devices (or, e.g., the address(es) associated there with) identified by the first set of data 476.

Controller 420 of integrated circuit device 405 can include an address decoder 432 configured to decode an operational characterization associated with addresses of ReRAM array 410. In response to receipt of first data 476 from host device 260, controller 420 can utilize address decoder 432 to determine whether first data 476 identifies an address associated with PUF addresses 412 of ReRAM array 410, or OTP addresses 414, MTP addresses 416 or RNG addresses 418, or other suitable operational characterization(s). Depending on this association, controller 420 can then utilize suitable trim settings 222 to implement switching device operations pertaining to command/instruction 480.

In some embodiments of controller 420 (and of controllers 320 and 520, where suitable), trim settings 222 may permit only a single memory operation for some resistive switching devices. Where trim settings 222 provide only one valid operation for a given operational characterization, or for a portion of resistive switching devices having that operational characterization, command/instruction 480 need not explicitly include data identifying a memory command. Rather, that command can be determined by controller 420 in response to determining the operational characterization from address decoder 432, identifying the addresses as those within or qualifying as the portion of resistive switching devices, and determining the lone valid operation stored in trim settings 222. As an illustrative example, where controller 420 identifies an OTP operational characterization, trim settings 222 can define a read operation to be the lone valid operation for resistive switching devices (that are part of OTP addresses 414) satisfying a first condition. That first condition can be, for example, having previously been programmed with OTP data. As a result, after utilizing address decoder 432 to determine the first data is specifying OTP addresses 414 and determining that resistive switching devices at the addresses satisfy the first condition, controller 420 can then determine from trim settings 222 that OTP read is the only valid operation for resistive switching devices at these addresses. Thus, in this example, command/instruction 480 need not explicitly identify a read command. As another example, where trim settings 222 and PUF algorithm(s) 324 do not permit erasure of previously generated PUF data, the lone valid operation can be a PUF read operation for PUF addresses 412 satisfying a second condition. The second condition can be, for instance, storing previously generated PUF data. Thus, where command/instruction 480 identifies resistive switching device addresses within PUF addresses 412 that satisfy the second condition, command/instruction 480 need not explicitly specify the PUF read command as that command can be inferred by controller 420 from trim settings 222, in such embodiments. As yet another example embodiment, trim settings 222 can establish that a PUF write is the only valid operation for PUF addresses that satisfy a third condition. The third condition can be, for instance, being in a native condition, having not been utilized to previously generate PUF data, or having not been utilized to previously store PUF data, as example alternatives. Accordingly, command/instruction 480 providing addresses associated with PUF addresses 412 need not include data specifying a memory operation when those addresses satisfy the third condition, and when trim settings 222 permit only a single operation for such PUF addresses. Requirements for command/instruction 480 based on trim settings 222 can be provided by controller 420, in an embodiment(s).

Second data 474 can optionally be included with command/instruction 480. The second data 474 can specify information to be stored at the memory cells, in some embodiments. In other embodiments, the second data 474 can specify 'FF' as write data, generally decoded by controller 420 as writing '1's to all identified addresses of command/instruction 480, e.g., in the context of a PUF write or RNG write operation. In alternative embodiments, second data is not included within command/instruction 480 by host device 260, but rather is received from integrated circuit device 405 in response to command/instruction 480 (e.g., where the second data is read data in response to a read operation). In sum, command/instruction 480 can include the first data, such as an address(es) 476 of one or more switching devices of the ReRAM array 410, and can optionally include second data 474 specifying data to be written to ReRAM array 410. In alternative embodiments second data 474 is received in response to command/instruction 480 instead. In some embodiments, command/instruction 480 can optionally include third data (not depicted) specifying a memory command (e.g., read, write, erase, overwrite, etc.) to be implemented on the one or more resistive switching devices, whereas in other embodiments controller 420 determines the memory command from and operational characteristic (e.g., 412, 414, 416, 418) associated with the identified addresses, trim settings 222 and a condition(s) of the switching devices at the identified addresses.

FIG. 5 illustrates a block diagram of an example host communication with direct input of ReRAM characterization 500, according to further embodiments of the present disclosure. In the embodiment(s) illustrated by direct input of ReRAM characterization 500, a host device 260 generates a command/instruction 580 provided to integrated circuit device 505. Command/instruction 580 is received at an interface 530 of integrated circuit device 505. Additionally, interface 530 includes one or more direct signal inputs 581 associated with operational characterizations of ReRAM array 310. A direct signal input 581 can be asserted in conjunction with command/instruction 580 to specify an operational characterization to be implemented together with command/instruction 580. Direct signal inputs 581 can be embodied by high/low pins, in an embodiment (e.g., an electrical contact that can have a high or a low setting to convey a bit of data), or other suitable direct signal inputs between a host device 260 and integrated circuit device 505. In various embodiments, direct signal inputs 581 include an input for respective operational characterizations recognized by a controller 520 for ReRAM array 310. When activated, a direct signal input 581 instructs controller 520 to utilize an operational characterization associated with the activated direct signal input 581. Included are an RNG input 582, an MTP input 584, an OTP input 586 and a PUF input 588, though inputs for other operational characterizations known in the art or reasonably conveyed to one of ordinary skill in the art by way of the context provided herein can be included with direct signal inputs 581.

Command/instruction 580 includes a first set of data 576 identifying resistive switching devices of ReRAM array 410 (e.g., through an address(es) associated with the resistive switching devices) and can optionally include second data 574 within command/instruction 580 or receive second data 574 in response to command/instruction 580, as suitable. As examples, second data 474 can include data to be written to the resistive switching devices or data received from the resistive switching devices. In one or more embodiments, command/instruction 480 can also include third data (not depicted) specifying a command to be executed on the resistive switching devices. In other embodiments, a command can be inferred by controller 520 without the third data, by reference to trim settings 222 and an operational characterization asserted by direct signal inputs 581, optionally together with one or more conditions associated with the resistive switching devices.

Figure 6:
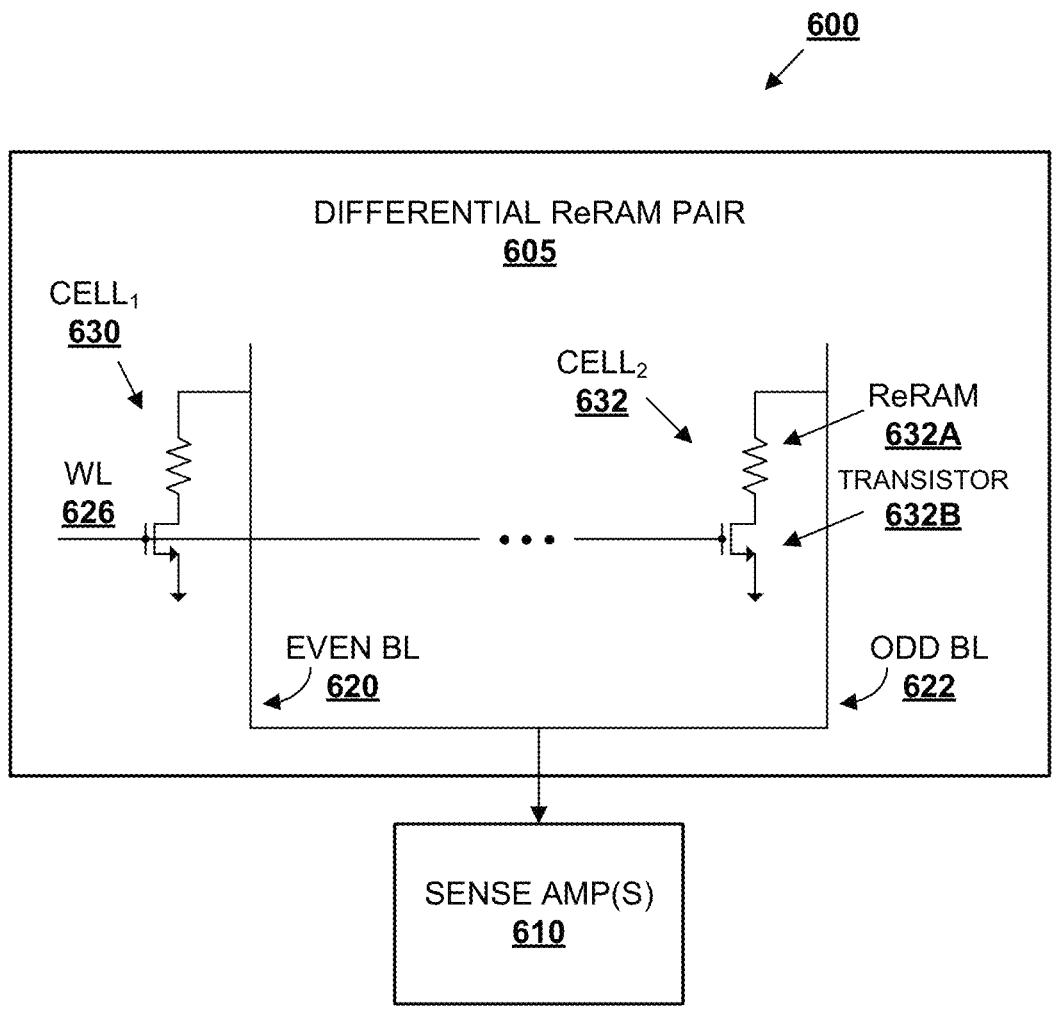
FIG. 6 depicts a block diagram of an example differential resistive switching memory coupling for differential memory operations, in one or more embodiments.

FIG. 6 illustrates a block diagram of an example differential PUF circuit 600 according to additional embodiments of the present disclosure. In the embodiment depicted by FIG. 6, differential PUF circuit 600 includes a differential resistive switching device pair 605 having outputs connected to a sense amp(s) 610. In other embodiments, larger numbers of differential switching devices can be aggregated to define a PUF bit instead.

In general, a differential PUF bit aggregates two or more resistive switching devices and digitizes the 'bit' based on relative responses of the aggregated devices to a PUF program event. As described herein, PUF program events can include many types of program signals to induce suitable responses in resistive switching devices. Rules stored by an integrated circuit device (e.g., in trim settings 222) can define how relative responses of devices that define a PUF bit to a PUF program event can establish a digital value for the PUF bit. As one illustrative example, in response to a PUF program event that asserts a sub-program voltage to two (or more) native resistive switching devices (having never been previously programmed) can measure a native leak current of the devices. In response to the first switching device satisfying a predetermined condition a first digital value (e.g., a '0') can be assigned to the PUF bit, whereas a native leak current of the second switching devices satisfying the predetermined condition can assign a second digital value (e.g., a '1') for the PUF bit. The predetermined condition can be any suitable comparison of switching device responses to themselves or to a fixed value or measurement. As a specific example, the predetermined condition can include: a native current higher than or lower than a threshold, a native current of the first device being higher than/lower than the second device, or the like, in the example of a PUF program event utilizing a sub-program voltage. Other suitable PUF program events described herein or reasonably conveyed to one of skill in the art by way of the context provided herein can be utilized for differential PUF programming, assuming rules for digitizing relative PUF programming response results of multiple bits can be suitably established, such as the examples given herein.

Differential pair 605 includes a first resistive switching cell, $cell_1$ 630 and a second resistive switching cell, $cell_2$ 632 (referred to collectively as cells 630, 632). Cells 630, 632 are one transistor, one resistor (1T1R) resistive switching cells, each comprising a ReRAM 632A and transistor 632B in electrical series combination. An even bitline 620 in an array is provided connected to $cell_1$ 630, and an odd bitline 622 in the array is provided connected to $cell_2$ 632. A wordline 626 is connected to gate nodes of the transistors 632B of cells 630, 632. When wordline 626 is activated and a PUF program signal applied to even bitline 620 or odd bitline 622 (or both), a response signal(s) is produced on a bitline(s) 620, 622 that can be measured at sense amp(s) 610.

Figure 7:
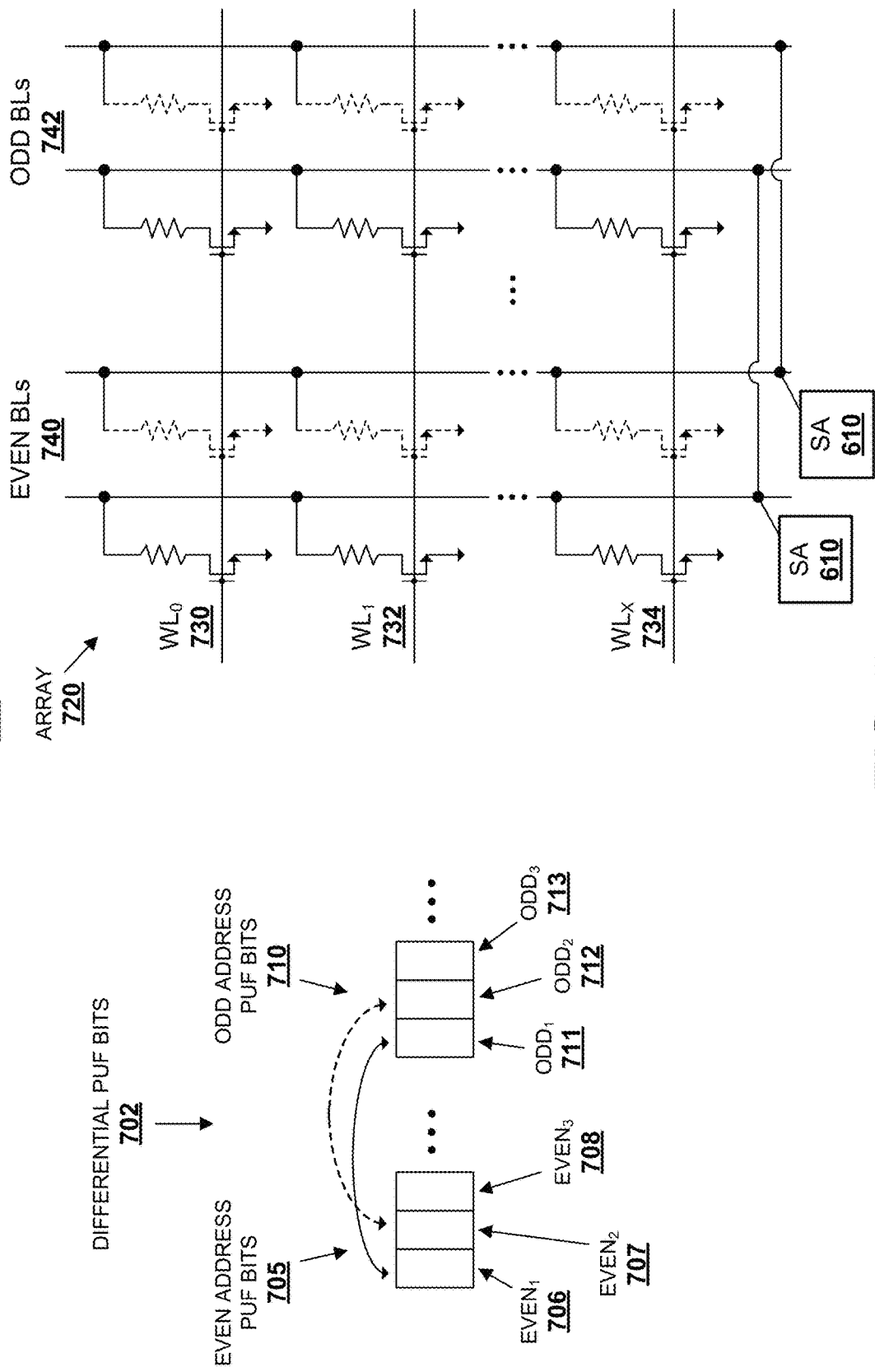
FIG. 7 depicts a block diagram of an example multi-bit differential bit coupling for physical unclonable feature (PUF) differential sequence generation, in an embodiment(s)
Figure 8:
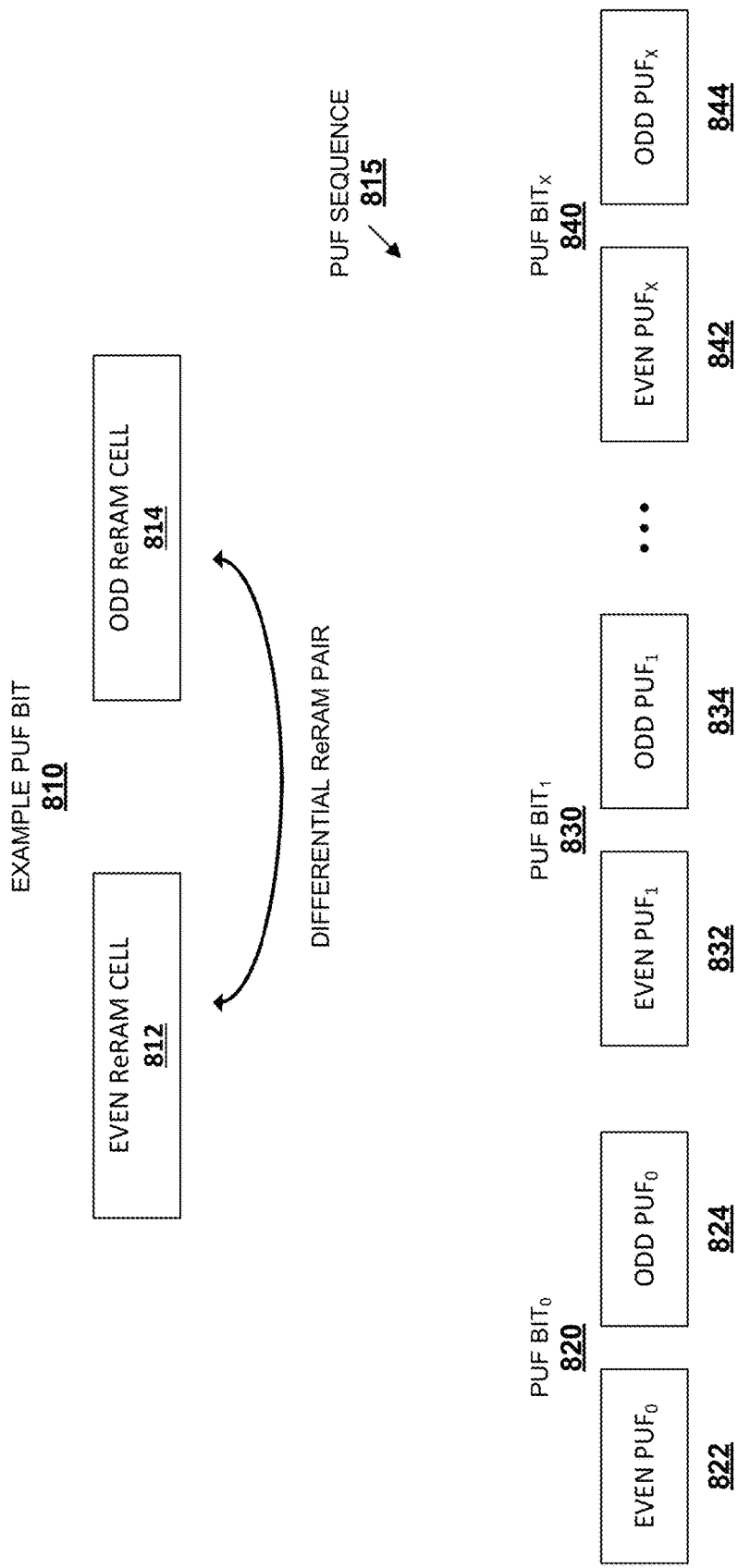
FIG. 8 illustrates an example diagram of a sequence of differential PUF bits according to still further embodiments of the present disclosure.

In one or more embodiments, differential PUF bits can be defined by aggregating pairs of resistive switching devices, including: one cell on an even bitline of an array with a second cell on an odd bitline of the array (e.g., see FIGS. 7 and 8, infra). Although even and odd bitlines provide a convenient example to define what cells to aggregate in defining a PUF bit, the subject disclosure is not so limited and cells on different even bitlines or cells on different odd bitlines can be aggregated in other embodiments. Further, in some embodiments, a PUF bit can be defined by a pair of cells on adjacent odd and even bitlines, whereas in other embodiments the PUF bit can be defined by a pair of cells on non-adjacent odd and even bitlines (or non-adjacent odd bitlines, or non-adjacent even bitlines).

FIG. 7 illustrates a diagram of an example arrangement 700 of differential identifier bits according to alternative or additional embodiments of the present disclosure. Differential identifier bits can be utilized for generating PUF data or for generating RNG data, in various embodiments. On the left-side of FIG. 7 is an illustration of example differential PUF bits 702 (also applicable to RNG bits). Even address portions 705 of the PUF bits 702 and odd address portions 710 of the PUF bits 702 are shown. Although illustrated as blocks, the blocks of even and odd address portions 705, 710 represent respective resistive switching cells of an array of resistive switching devices 720. The respective resistive switching cells can be the same or similar to cells 630, 632 of FIG. 6 in some embodiments, whereas in other embodiments a resistive switching cell can have other arrangements of a resistive switching device and one or more transistors, as well as one or more other analog or digital circuit components suitable for a resistive switching cell known in the art or reasonably conveyed to one of ordinary skill in the art by way of the context presented herein, all of which are considered within the scope of the present disclosure.

Differential PUF bits 702 illustrate three PUF bits and respective even and odd memory cells forming the PUF bits. Even $cell_1$ 706 and odd $cell_1$ 711 form a first PUF bit, even $cell_2$ 707 and odd $cell_2$ 712 form a second PUF bit, and even $cell_3$ 708 and odd $cell_3$ 713 form a third PUF bit. Array 720 illustrates an arrangement of wordlines and bitlines defining an array of multiple resistive switching cells according to some disclosed embodiments. Two pairs of differential PUF bits 702 can be defined on each wordline depicted by array 720, but it should be understood that many more pairs of differential PUF bits 702 can be defined in an array that is not limited by drawing area constraints, as one of skill in the art would readily understand.

The wordlines include wordline 730, $wordline_1$ 732 through $wordline_x$ 734, where x is a suitable integer larger than 1, referred collectively as wordlines 730-734. Likewise, the bitlines include even bitlines 740 and odd bitlines 742. A PUF bit 702 can be defined at a wordline and include a memory cell (e.g., $even_1$ 706) connected to one bitline of even bitlines 740 and a second memory cell (e.g., $odd_1$ 711) connected to one bitline of odd bitlines 742. A second PUF bit 702, can be defined by even and odd memory cells (e.g., $even_2$ 707 and $odd_2$ 712) on the same wordline (e.g., $wordline_0$ 730) adjacent to the memory cell and second memory cell, in an embodiment(s). In alternative embodiments, the second PUF bit 702 can be defined by memory cells that are on non-adjacent bitlines with respect to the memory cell and second memory cell, while still on the same wordline. In still other embodiments, the second PUF bit 702 can be defined by even and odd memory cells on a different wordline (e.g., $wordline_1$ 732). Moreover, any plurality of the PUF bit, second PUF bit, a third PUF bit (e.g., defined by $even_3$ 708 and $odd_3$ 713), or other PUF bits not depicted can form a PUF data sequence (or portion thereof) when on the same wordline in either adjacent or non-adjacent bitlines, or on different wordlines in adjacent or non-adjacent bitlines, or suitable combinations of the foregoing. Where PUF bits of a data sequence reside on different wordlines, suitable inhibition circuitry or signal processes can be provided for array 720 to mitigate or avoid bit disturb effects on memory cells not associated with the data sequence, or PUF bits on a subset of bitlines or wordlines can be operated upon sequentially while inhibiting other portions of the bitlines and wordlines connected to one or more PUF bits, or a suitable combination of the foregoing.

FIG. 8 illustrates an example of a differential identifier bit 800, in various embodiments. Differential identifier bit 800 can be a PUF bit in some embodiments (e.g., when the PUF bit is defined by native, never-programmed resistive switching devices) or can be a RNG bit in other embodiments (e.g., when the PUF bit is defined by native or non-native resistive switching devices, and where the switching devices are previously programmed, having a same or near-same program cycle count, in at least one embodiment). The following description will be directed to PUF identifier bits but can be applicable to RNG identifier bits as well.

A differential PUF bit 800 comprises a group of memory cells, including a memory cell at an even bitline (an even cell) and a memory cell at an odd bitline (an odd cell). The grouping to define the differential PUF bit 800 can be through tying their respective even and odd bitlines to a shared sense amp (e.g., see FIGS. 6 and 7, supra). In response to receipt of a PUF write operation (e.g., from a host device 260), a suitable PUF program event is applied to both the even cell and the odd cell to generate a data value for the differential PUF bit 800. The program event can be accompanied by all '1's with or within a host command as the 'data' to implement the PUF write, or a controller will set the data to '1's in response to receiving the host command specifying (or implying) the PUF write.

In response to the PUF write, assuming the binary digital context, the even cell or odd cell will satisfy a PUF write criterion associated with a digital '1'. For example, the even cell or the odd cell will become programmed in response to the PUF program event, and depending on which is programmed the PUF bit will have either a '1' value or a '0' value. Rules for defining digitization of the PUF bit value can determine whether the even cell or odd cell has a state matching the PUF bit value, and therefore which cell contains the value of the PUF bit. As an illustrative example, where digitization rules define a PUF bit of '0' when the even cell is programmed to a low resistance state (e.g., conventionally corresponding to a digital '1' value) and a PUF bit of '1' when the odd cell is programmed to the low resistance state (e.g., the conventional '1'), the rules establish the odd cell as matching the digital value of the PUF bit and the even cell matching an inverse of the PUF bit. Conversely, where alternative rules define a PUF bit of '1' when the even cell is programmed and a PUF bit value of '0' when the odd cell is programmed, the even cells will contain the PUF bit value and the odd cells will contain the inverse of the PUF bit value.

FIG. 8 also depicts an x-bit PUF data sequence 815, where x can be any suitable integer greater than 0. To generate a PUF key for cryptographic purposes, for example, x can be 128 bits, 256 bits, 512 bits, 1024 bits, and so forth or any suitable value or range there between in various embodiments. The x-bit PUF data sequence can produce x bits of highly non-correlated data by leveraging inherent stochastic characteristics of native resistive switching devices. For instance, measurable responses to program events that depend upon the stochastic characteristics of the resistive switching devices will be non-correlated, and when digitized produce the non-correlated data. Selecting a suitable number of PUF bits to generate the needed number of data bits will therefore produce a PUF cryptographic key having excellent randomness between bits of the key, between different keys, and so forth.

PUF data sequence 815 includes a zeroth $PUF\ bit_0$ 820, a first $PUF\ bit_1$ 830 and an $x^{th}\ PUF\ bit_x$ 840 (referred to collectively as PUF bits 820-840). The PUF bits 820-840 can be embodied by groups of differential memory cells as illustrated by FIGS. 6 and 7, though PUF bits 820-840 can use non differential PUF data generation techniques using only a single resistive switching device per PUF bit as described herein as well. Utilizing pairs of memory cells to create a differential PUF bit sequence, PUF $bit_0$ 820 can comprise even PUF $cell_0$ 822 and odd PUF $cell_0$ 824, PUF $bit_1$ 830 can comprise even PUF $cell_1$ 832 and odd PUF $cell_1$ 834 and PUF $bit_x$ 840 can comprise even PUF $cell_x$ 842 and odd PUF $cell_x$ 844. Upon generating PUF data in each of PUF bits 820-840, the PUF data will be stored in either the even PUF cells or the odd PUF cells (with the inverse of the PUF data being stored in the odd or even, respectively), depending on the digitization rules utilized for PUF sequence 815 (e.g., stored in trim settings 222 or any other suitable non-volatile memory of an integrated circuit device) containing the resistive switching devices of PUF sequence 815.

The diagrams included herein are described with respect to several circuits, controllers, interfaces and arrays of resistive switching devices or an integrated circuit device(s) comprising multiple circuits, controllers, interfaces or arrays. It should be appreciated that such diagrams can include those circuits, controllers, etc., specified therein, some of the specified circuits/controllers/interfaces/arrays, or additional circuits/controllers/interfaces/arrays not explicitly depicted but known in the art or reasonably conveyed to those of skill in the art by way of the context provided herein. Components of disclosed integrated circuit devices can also be implemented as sub-components of another disclosed component (e.g., input 240 and output 250 can be sub-components of controller 220), whereas other components disclosed as sub-components can be separate components in various embodiments (e.g., PUF addresses 412, OTP addresses 414, MTP addresses 416 and RNG addresses 418 can be separate arrays as opposed to subsets of array 410). Further, embodiments within a particular Figure of the present specification can be applied in part or in whole to other embodiments depicted in other Figures without limitation, subject only to suitability to achieving a disclosed function or purpose as understood by one of skill in the art, and vice versa. As an illustrative example(s), arrays of resistive switching devices as depicted in FIGS. 1-5 can be populated with differential ReRAM pairs 605 of FIG. 6, can be operably coupled with any of controllers 120, 220, 420 and 520, or substituted for memory array 1402 of FIG. 14, or volatile memory 1510A or non-volatile memory 1510B of FIG. 15, or suitable components of operating and control environment 1400 or environment 1500 can be substituted or added to other components or integrated circuit devices disclosed herein, and so forth. Additionally, it is noted that one or more disclosed processes can be combined into a single process providing aggregate functionality. For instance, a write process can comprise a read-verify process, or vice versa, to facilitate storing data at memory or generating data within memory and reading that stored/generated data, by way of a single process. Components of the disclosed architectures can also interact with one or more other components not specifically described herein but known by those of skill in the art.

In view of the exemplary diagrams described supra, process methods that can be implemented in accordance with the disclosed subject matter will be better appreciated with reference to the flow charts of FIGS. 9-13. While for purposes of simplicity of explanation, the methods of FIGS. 9-13 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks may be required to implement the methods described herein, and in some embodiments additional steps known in the art or reasonably conveyed to one of ordinary skill in the art by way of the context provided herein are also considered within the scope of the present disclosure. Moreover, some steps illustrated as part of one process can be implemented for another process where suitable; other steps of one or more processes can be added or substituted in other processes disclosed herein within the scope of the present disclosure. Additionally, it should be further appreciated that the methods disclosed throughout this specification are capable of being stored on an article of manufacture to facilitate transporting and transferring such methodologies to an electronic device, stored in embedded memory within the electronic device, and so forth. The term article of manufacture, as used, is intended to encompass a computer program accessible from any computer-readable device, device in conjunction with a carrier, or storage medium, or the like.

Figure 9:
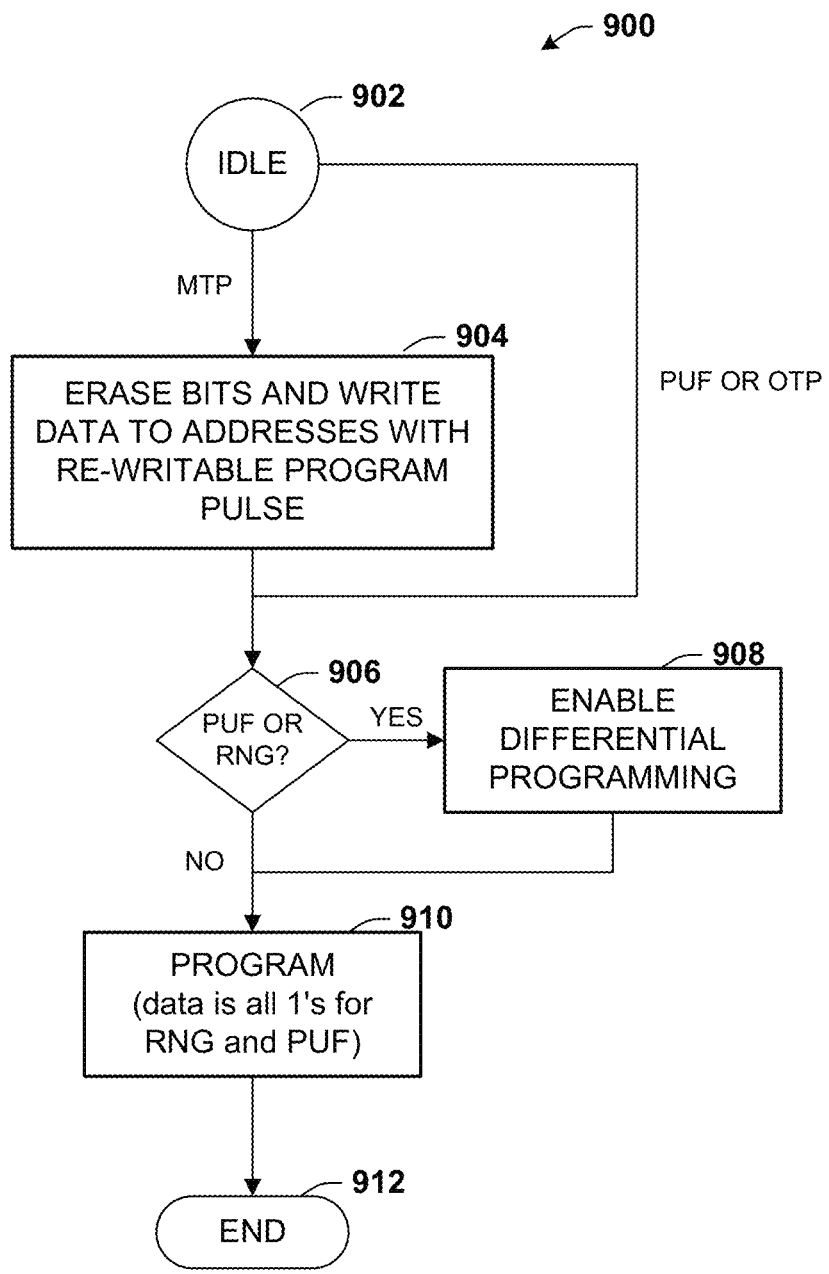
FIG. 9 depicts a flowchart of a sample method for managing operational characteristics of a RS array in response to external host device commands, in an embodiment.

FIG. 9 illustrates a flowchart of an example method 900 according to one or more embodiments of the present disclosure. Method 900 can begin at idle at 902, and in response to receiving a write command at idle can proceed to 904 if the command is a MTP write command, or can proceed to 906 if the command is an identifier write or OTP write command. At 904, method 900 can comprise erasing bits identified with the MTP write command and writing data to the bits with a re-writable program pulse. AT 906, method 900 can comprise determining whether the command is a PUF or RNG write, and proceed to 908 if so, and proceed directly to 910 otherwise. At 908, method 900 can comprise enabling differential programming for the PUF or RNG write command. At 910, method 900 can comprise writing specified data to the addresses identified by the write command, or in the case of PUF or RNG write commands, write all '1's to the differential memory cells associated with the addresses. For an OTP write command, the operation can utilize a one-time programmable write pulse. For a PUF write command, a selective one-time programmable write command can optionally follow a PUF generation pulse that applies the one-time programmable write pulse only to cells that become programmed in response to the PUF generation pulse (e.g., where the PUF generation pulse is a pulse configured to program at least one of the differential memory cells).

Figure 10:
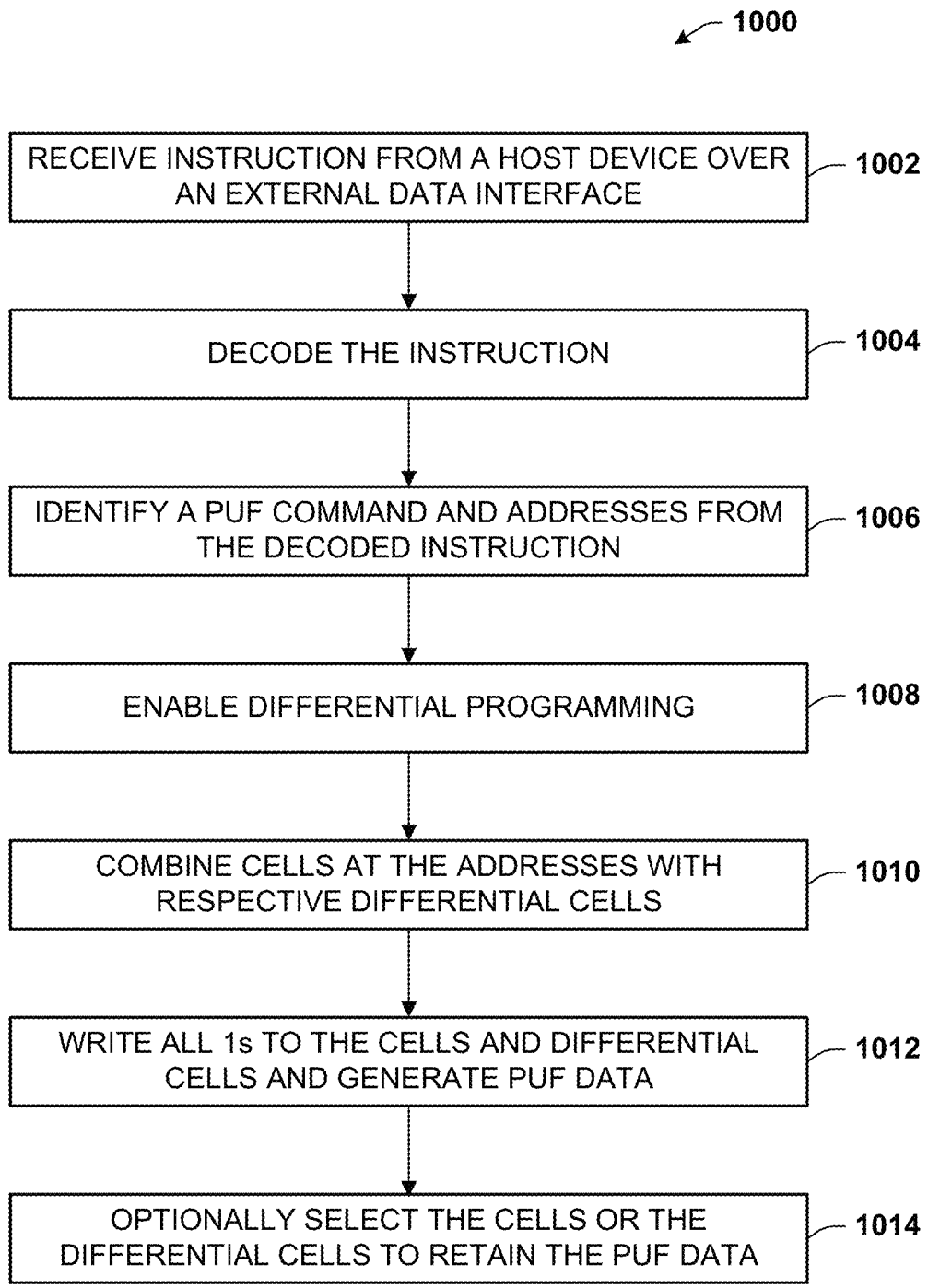
FIG. 10 illustrates a flowchart of an example method for implementing a PUF operation on host-selected addresses within an RS array, in additional embodiments.

FIG. 10 depicts a flowchart of a sample method 1000 according to alternative or additional embodiments of the present disclosure. Method 1000 can comprise, at 1002, receiving an instruction from a host device over an external data interface. In an embodiment, the external data interface can be embodied on an integrated circuit device, and the host device can be separate from the integrated circuit device communicating with the integrated circuit device by way of the external data interface.

At 1004, method 1000 can comprise decoding the instruction. At 1006, method 1000 can comprise identifying a PUF command and addresses from the decoded instruction. At 1008, method 1000 can comprise enabling differential programming for the PUF command. At 1010, method 1000 can comprise combining cells at the addresses with respective differential cells forming differential PUF bits. Differential PUF bits can comprise two or more resistive switching memory cells aggregated for a differential program process. In an embodiment where a pair of resistive switching memory cells define a differential PUF bit, each differential PUF bit can respectively comprise one cell at the addresses (e.g., an even address) and one of the differential cells (e.g., an odd address). At 1012, method 1000 can comprise writing all '1's to the cells at the addresses and to the differential cells to generate PUF data for the differential PUF bits. At 1014, method 1000 can optionally comprise selecting the cells at the addresses or the differential cells to retain the PUF data. Method 1000 can also optionally comprise deleting data from either the cells at the addresses or the differential cells.

Figure 11:
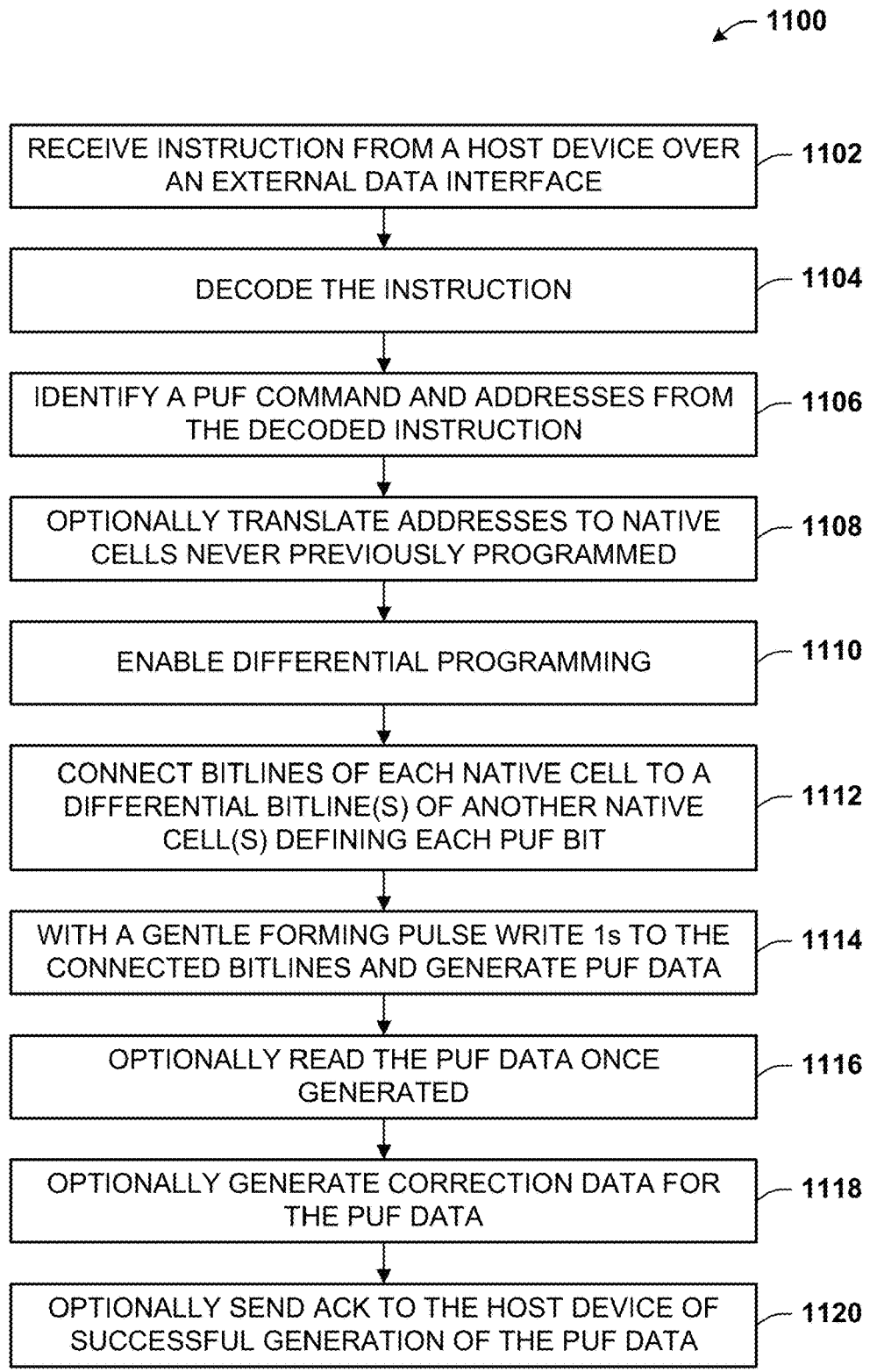
FIG. 11 depicts a flowchart of a sample method of implementing differential PUF data generation in response to an external host command, in further embodiments.

FIG. 11 illustrates a flowchart of a sample method 1100 for implementing a PUF operation at a memory device. In various embodiments, the PUF operation can be implemented in response to receiving a host command from a host device external to the memory device. For example, at 1102, method 1100 can comprise receiving instruction from a host device over an external data interface. At 1104, method 1100 can comprise decoding the instruction, and at 1106 method 1100 can comprise identifying a PUF command and locations (e.g., addresses) of memory cells of the memory device from the decoded instruction. Optionally, the locations received from the instruction can be translated to physical locations within an array of native memory cells having (e.g., having never been previously programmed to a low resistance state).

At 1110, method 1100 can comprise enabling differential programming. At 1112, method 1100 can comprise connecting bitlines of native memory cells to respective differential bitlines of respective differential native memory cells to define PUF bits. At 1114, method 1100 can comprise writing '1's to the PUF bits with a gentle forming pulse. The gentle forming pulse can be selected to cause one native memory cell of each PUF bit to become programmed to a low resistance state from a native high resistance state, in an embodiment. In response to the gentle forming pulse, PUF data is generated at the PUF bits. At 1116, method 1100 can optionally comprise reading the PUF data once generated, and at 1118 method 1100 can optionally comprise generating correction data for the PUF data. At 1120, method 1100 can comprise optionally sending an acknowledgment 'ACK' signal to the host device in response to generating the PUF data. The ACK signal can indicate a successful generation of the PUF data to the host device, in an embodiment.

Figure 12:
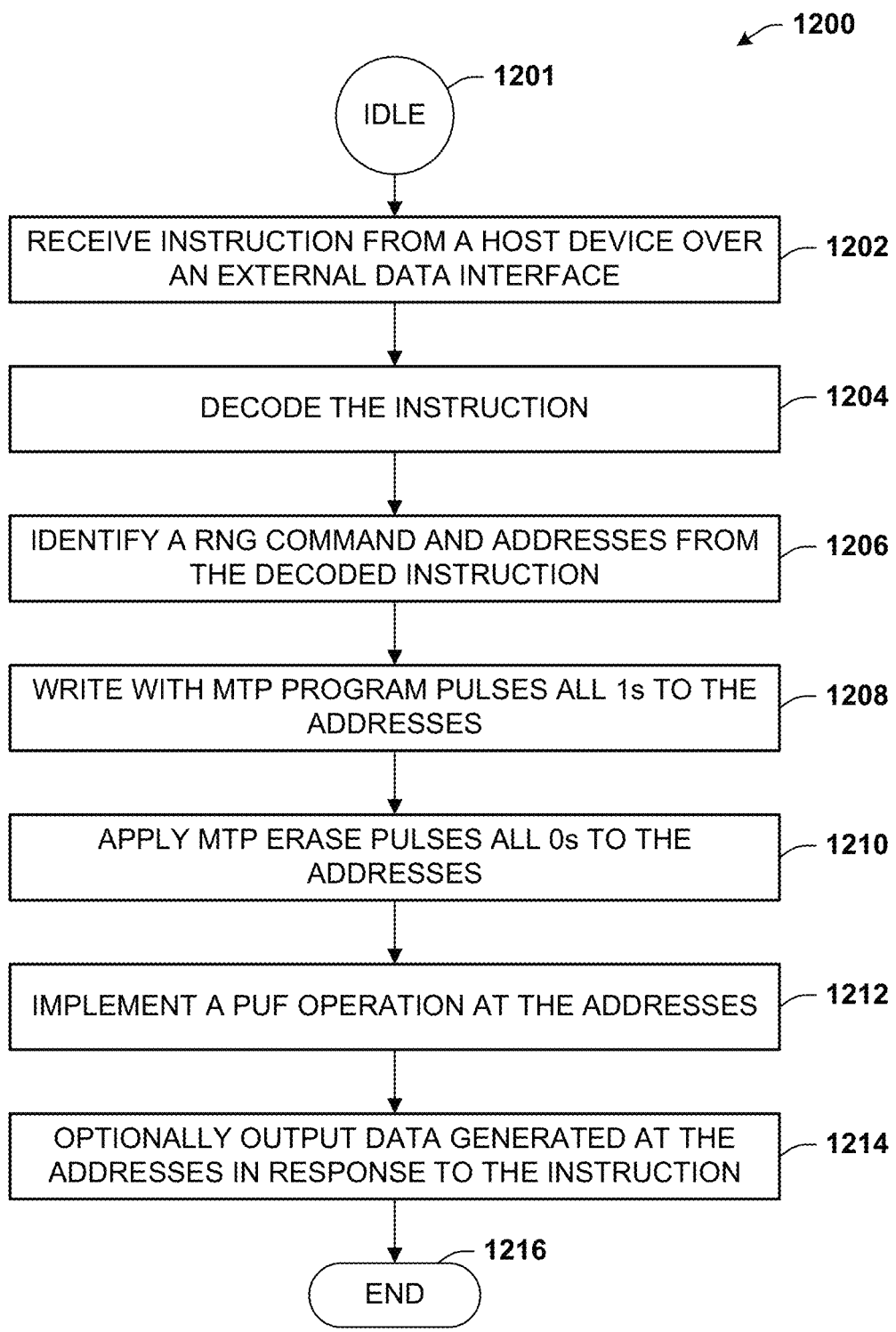
FIG. 12 illustrates a flowchart of an example method for implementing a random number generation (RNG) command on a RS array, in other embodiments.

FIG. 12 depicts a flowchart of an example method 1200 for implementing a RNG process in response to an external host command, in further embodiments. Method 1200 can begin in an idle state at 1201, and at 1202, method 1200 can comprise receiving an instruction from a host device over an external interface. In an embodiment(s), the external interface can be a component of an integrated circuit device comprising a resistive switching device array, and the host device can be external to the integrated circuit device. At 1204, method 1200 can comprise decoding the instruction and, at 1206, method 1200 can comprise identifying a RNG command and addresses from the decoded instruction. In an embodiment, the addresses can identify physical or virtual locations of resistive switching devices of the array for implementing the RNG command. In a further embodiment, the RNG command can be a RNG write command, a RNG read command or a RNG erase command. The RNG erase command, in one or more embodiments, can prepare bits of the array for generating subsequent RNG data, as one example. Note that addresses for the RNG command could be native resistive switching devices of the array, but also could include previously programmed resistive switching devices. In an embodiment, the previously programmed resistive switching devices can be selected to have a low cycle count. Examples of suitable cycle count for the RNG write command—depending on manufacturing process, construction or composition of the resistive switching devices of the array—can include: fewer than 10,000 program cycles; fewer than 1,000 program cycles; fewer than 500 program cycles; fewer than 100 program cycles; fewer than 50 program cycles; fewer than 25 program cycles; fewer than 10 program cycles; or any suitable value or range there between.

At 1208, method 1200 can comprise writing 1's to switching devices at locations identified by the addresses decoded from the instruction. The writing can be implemented with an MTP program pulse, in various embodiments, causing the switching devices at the addresses to enter a low resistance state. At 1210, method 1200 can comprise applying an erase pulse to write 0s (e.g., a high resistance state) to the addresses. Writing with the erase pulse can comprise implementing an MTP erase pulse to cause the switching devices at the addresses to enter a high resistance state. At 1212, method 1200 can comprise implementing a PUF operation(s) at the addresses. The PUF operation(s) can be an identifier process described herein, in various embodiments. At 1214, method 1200 can optionally comprise outputting data generated at the addresses in response to the instruction. The data can be output to the host device, in an embodiment. At method 1216, method 1200 can end.

Figure 13:
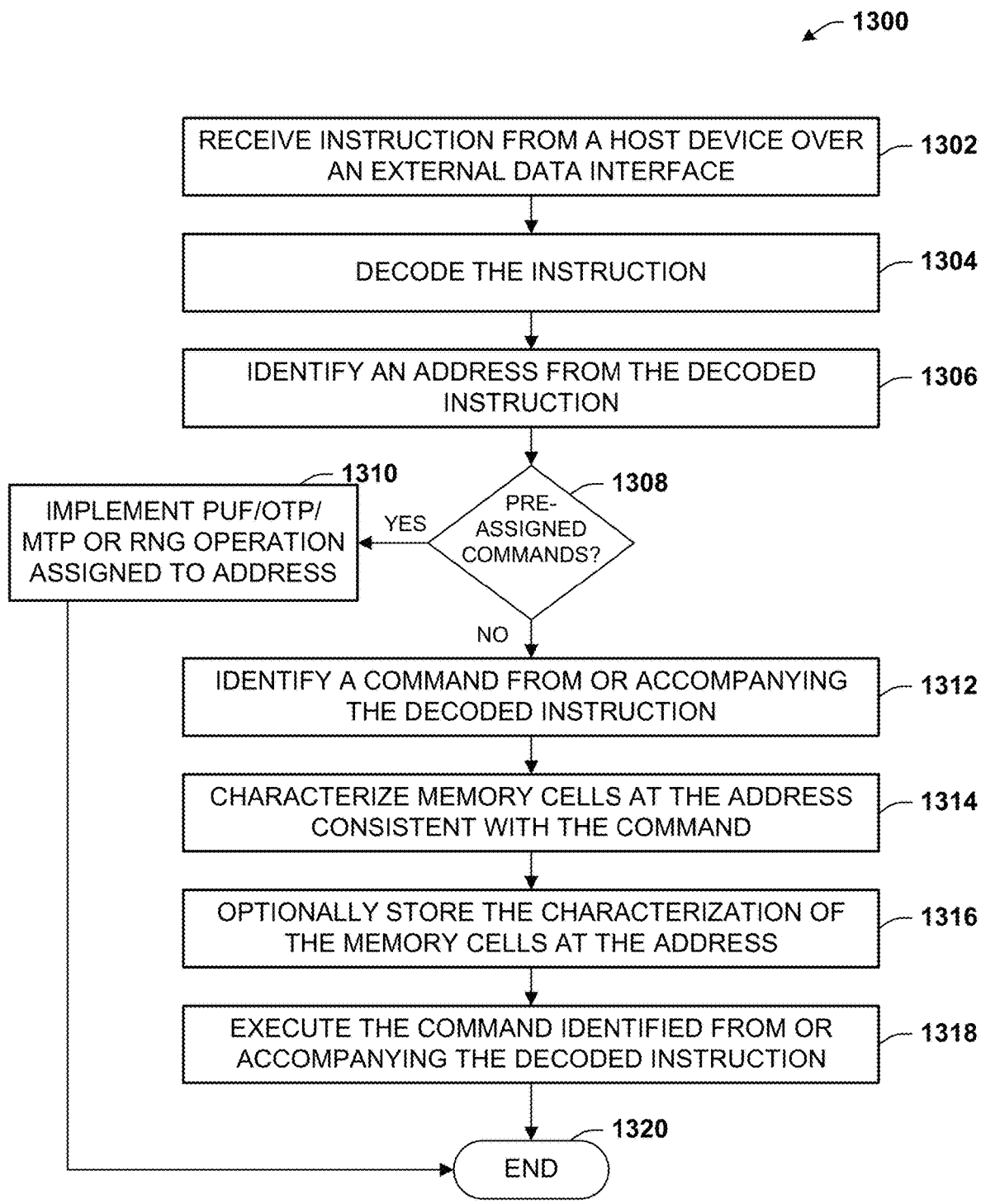
FIG. 13 depicts a flowchart of a sample method for managing operational characteristics of a RS array in response to external host commands, in additional embodiments.

FIG. 13 illustrates a flowchart of a sample method 1300 for operating an integrated circuit device comprising resistive switching devices, in further embodiments of the present disclosure. At 1302, method 1300 can comprise receiving instruction from a host device over an external data interface. At 1304, method 1300 can comprise decoding the instruction and, at 1306, method 1300 can comprise identifying an address from the decoded instruction. At 1306, method 1300 can optionally determine whether portions of the array have pre-assigned operational characterizations. If yes, method 1300 can proceed to 1310 and can comprise implementing an operation consistent with a pre-assigned operational characterization associated with the address from the decoded instruction. From reference number 1310, method 1300 can end at 1320.

At 1312, method 1300 can comprise identifying a command from or accompanying the decoded instruction. At 1314, method 1300 can comprise characterizing memory cells at the address consistent with the command. At 1316, method 1300 can optionally comprise storing the characterization of the memory cells at the addresses. At 1318, method 1300 can comprise executing the command identified from or accompanying the decoded instruction. From reference number 1318, method 1300 can end at 1320.

Example Operating Environments

Figure 14:
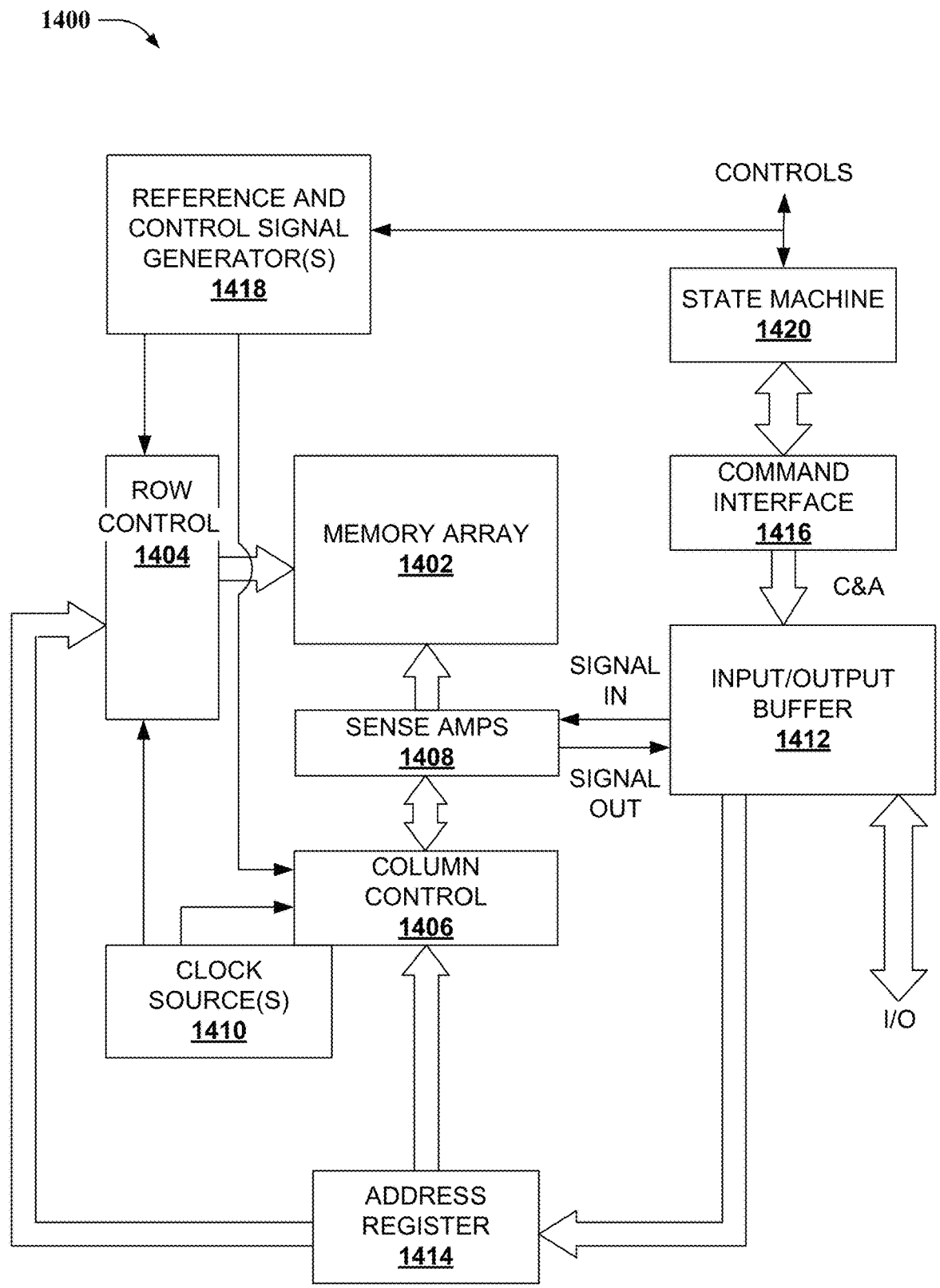
FIG. 14 illustrates a block diagram of a sample electronic operating environment in accordance with certain embodiments presented herein.

FIG. 14 illustrates a block diagram of an example operating and control environment 1400 for a memory array 1402 of a memory device according to aspects of the subject disclosure. Control environment 1400 and memory array 1402 can be formed within a single semiconductor die in some embodiments, although the subject disclosure is not so limited and in other embodiments some components of control environment 1400 can be formed on a separate semiconductor die. In at least one aspect of the subject disclosure, memory array 1402 can comprise memory selected from a variety of memory cell technologies. In at least one embodiment, memory array 1402 can comprise a two-terminal memory technology, arranged in a compact two or three-dimensional architecture. Suitable two-terminal memory technologies can include resistive-switching memory, conductive-bridging memory, phase-change memory, organic memory, magneto-resistive memory, or the like, or a suitable combination of the foregoing. In a further embodiment, the two-terminal memory technology can be a two-terminal resistive switching technology.

A column controller 1406 and sense amps 1408 can be formed adjacent to memory array 1402. Moreover, column controller 1406 can be configured to activate (or identify for activation) a subset of bit lines of memory array 1402. Column controller 1406 can utilize a control signal provided by a reference and control signal generator(s) 1418 to activate, as well as operate upon, respective ones of the subset of bitlines, applying suitable program, erase or read voltages to those bitlines. Non-activated bitlines can be kept at an inhibit voltage (also applied by reference and control signal generator(s) 1418), to mitigate or avoid bit-disturb effects on these non-activated bitlines.

In addition, operating and control environment 1400 can comprise a row controller 1404. Row controller 1404 can be formed adjacent to and electrically connected with word lines of memory array 1402. Also utilizing control signals of reference and control signal generator(s) 1418, row controller 1404 can select particular rows of memory cells with a suitable selection voltage. Moreover, row controller 1404 can facilitate program, erase or read operations by applying suitable voltages at selected word lines.

Sense amps 1408 can read data from, or write data to, the activated memory cells of memory array 1402, which are selected by column control 1406 and row control 1404. Data read out from memory array 1402 can be provided to an input/output buffer 1412. Likewise, data to be written to memory array 1402 can be received from the input/output buffer 1412 and written to the activated memory cells of memory array 1402.

A clock source(s) 1410 can provide respective clock pulses to facilitate timing for read, write, and program operations of row controller 1404 and column controller 1406. Clock source(s) 1410 can further facilitate selection of word lines or bit lines in response to external or internal commands received by operating and control environment 1400. Input/output buffer 1412 can comprise a command and address input, as well as a bidirectional data input and output. Instructions are provided over the command and address input, and the data to be written to memory array 1402 as well as data read from memory array 1402 is conveyed on the bidirectional data input and output, facilitating connection to an external host apparatus, such as a computer or other processing device (not depicted, but see e.g., computer 1502 of FIG. 15, infra).

Input/output buffer 1412 can be configured to receive write data, receive an erase instruction, receive a status or maintenance instruction, output readout data, output status information, and receive address data and command data, as well as address data for respective instructions. Address data can be transferred to row controller 1404 and column controller 1406 by an address register 1414. In addition, input data is transmitted to memory array 1402 via signal input lines between sense amps 1408 and input/output buffer 1412, and output data is received from memory array 1402 via signal output lines from sense amps 1408 to input/output buffer 1412. Input data can be received from the host apparatus, and output data can be delivered to the host apparatus via the I/O bus.

Commands received from the host apparatus can be provided to a command interface 1416. Command interface 1416 can be configured to receive external control signals from the host apparatus and determine whether data input to the input/output buffer 1412 is write data, a command, or an address. Input commands can be transferred to a state machine 1420.

State machine 1420 can be configured to manage programming and reprogramming of memory array 1402 (as well as other memory banks of a multi-bank memory array). Instructions provided to state machine 1420 are implemented according to control logic configurations, enabling state machine 1420 to manage read, write, erase, data input, data output, and other functionality associated with memory cell array 1402. In some aspects, state machine 1420 can send and receive acknowledgments and negative acknowledgments regarding successful receipt or execution of various commands. In further embodiments, state machine 1420 can decode and implement status-related commands, decode and implement configuration commands, and so on.

To implement read, write, erase, input, output, etc., functionality, state machine 1420 can control clock source(s) 1410 or reference and control signal generator(s) 1418. Control of clock source(s) 1410 can cause output pulses configured to facilitate row controller 1404 and column controller 1406 implementing the particular functionality. Output pulses can be transferred to selected bit lines by column controller 1406, for instance, or word lines by row controller 1404, for instance.

Figure 15:
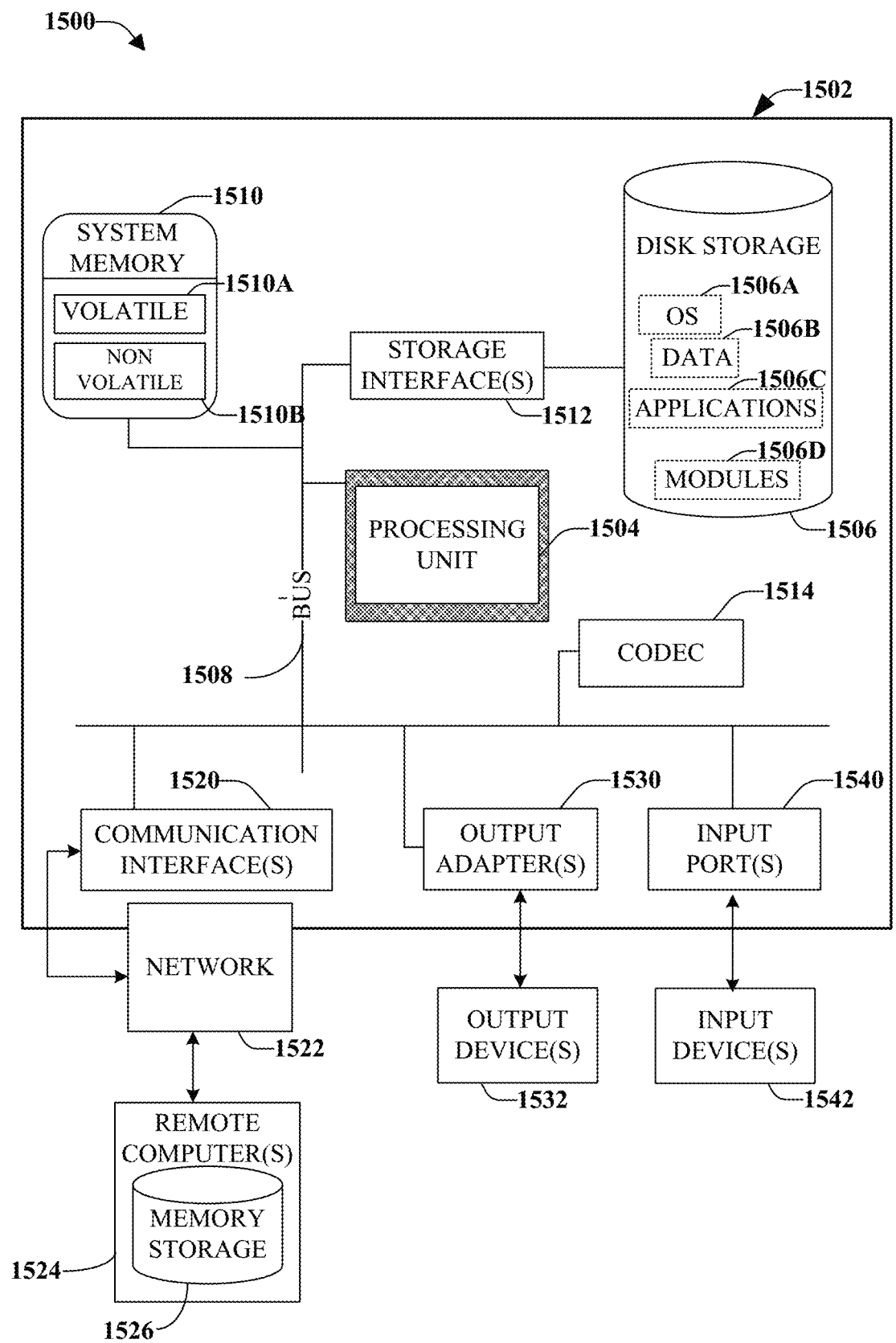
FIG. 15 depicts a block diagram of an example computing environment for implementing one or more disclosed embodiments of the present disclosure.

In connection with FIG. 15, the systems, devices, and/or processes described herein can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

With reference to FIG. 15, a suitable environment 1500 for implementing various aspects of the claimed subject matter includes a computer 1502. The computer 1502 includes a processing unit 1504, a system memory 1510, a codec 1514, and a system bus 1508. The system bus 1508 couples system components including, but not limited to, the system memory 1510 to the processing unit 1504. The processing unit 1504 can be any of various available processors. Dual microprocessors and other multiprocessor architectures also can be employed as the processing unit 1504.

The system bus 1508 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1510 includes volatile memory 1510A and non-volatile memory 1510B. The basic input/output system (BIOS), containing the basic routines to transfer information between elements within the computer 1502, such as during start-up, is stored in non-volatile memory 1510B. In addition, according to present innovations, codec 1514 may include at least one of an encoder or decoder, wherein the at least one of an encoder or decoder may consist of hardware, software, or a combination of hardware and software. Although, codec 1514 is depicted as a separate component, codec 1514 may be contained within non-volatile memory 1510B. By way of illustration, and not limitation, non-volatile memory 1510B can include read only memory (ROM), programmable ROM (PROM), electrically programmable ROM (EPROM), electrically erasable programmable ROM (EEPROM), or flash memory, two-terminal memory, and so on. Volatile memory 1510A includes random access memory (RAM), and in some embodiments can embody a cache memory. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ES-DRAM).

Computer 1502 may also include removable/non-removable, volatile/non-volatile computer storage medium. FIG. 15 illustrates, for example, disk storage 1506. Disk storage 1506 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1506 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1506 to the system bus 1508, a removable or non-removable interface is typically used, such as storage interface 1512. It is appreciated that storage devices 1506 can store information related to a user. Such information might be stored at or provided to a server or to an application running on a user device. In one embodiment, the user can be notified (e.g., by way of output device(s) 1532) of the types of information that are stored to disk storage 1506 or transmitted to the server or application. The user can be provided the opportunity to opt-in or opt-out of having such information collected and/or shared with the server or application (e.g., by way of input from input device(s) 1542).

It is to be appreciated that FIG. 15 describes software that acts as an intermediary between users and the basic computer resources described in the suitable operating environment 1500. Such software includes an operating system 1506A. Operating system 1506A, which can be stored on disk storage 1506, acts to control and allocate resources of the computer system 1502. Applications 1506C take advantage of the management of resources by operating system 1506A through program modules 1506D, and program data 1506D, such as the boot/shutdown transaction table and the like, stored either in system memory 1510 or on disk storage 1506. It is to be appreciated that the claimed subject matter can be implemented with various operating systems or combinations of operating systems.

A user enters commands or information into the computer 1502 through input device(s) 1542. Input devices 1542 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1504 through the system bus 1508 via input port(s) 1540. Input port(s) 1540 include, for example, a serial port, a parallel port, a game port, and a universal serial bus (USB). Output device(s) 1532 use some of the same type of ports as input device(s) 1542. Thus, for example, a USB port may be used to provide input to computer 1502 and to output information from computer 1502 to an output device 1532.

Output adapter 1530 is provided to illustrate that there are some output devices 1532 like monitors, speakers, and printers, among other output devices 1532, which require special adapters. The output adapters 1530 include, by way of illustration and not limitation, video and sound cards that provide a means of connection between the output device 1532 and the system bus 1508. It should be noted that other devices and/or systems of devices provide both input and output capabilities such as remote computer(s) 1538.

Computer 1502 can operate in a networked environment using logical connections to one or more remote computers, such as remote computer(s) 1524. The remote computer(s) 1524 can be a personal computer, a server, a router, a network PC, a workstation, a microprocessor based appliance, a peer device, a smart phone, a tablet, or other network node, and typically includes many of the elements described relative to computer 1502. For purposes of brevity, only a memory storage device 1526 is illustrated with remote computer(s) 1524. Remote computer(s) 1524 is logically connected to computer 1502 through a network 1522 and then connected via communication interface(s) 1520. Network 1522 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication interface(s) 1520 refers to the hardware/software employed to connect the network 1522 to the bus 1508. While communication interface(s) 1520 is shown for illustrative clarity inside computer 1502, it can also be external to computer 1502. The hardware/software necessary for connection to the network 1522 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In this regard, it will also be recognized that the embodiments include a system as well as a computer-readable medium having computer-executable instructions for performing the acts and/or events of the various processes.

In addition, while a particular feature may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising".

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Further embodiments can be envisioned to one of ordinary skill in the art after reading this disclosure. For example, in various embodiments, erase operations may be initiated upon a plurality of ReRAM devices (e.g., 16, 32, etc.) at the same time.

In other embodiments, combinations or sub-combinations of the above disclosed embodiments can be advantageously made. The block diagrams of the architecture and flow charts are grouped for ease of understanding. However, it should be understood that combinations of blocks, additions of new blocks, re-arrangement of blocks, and the like are contemplated in alternative embodiments of the present disclosure.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An electronic device, comprising:
   a resistive switching memory array comprising a plurality of resistive switching memory cells;
   an interface configured to receive at the electronic device a communication from a host device that is external to the electronic device, wherein the communication includes first data indicative of an address of a group of memory cells of the plurality of resistive switching memory cells of the resistive switching memory array for implementing a memory command and second data specifying the memory command from a set of memory commands;
   a set of trims that store instructions for configuring the resistive switching memory array to implement memory commands of the set of memory commands and for executing the memory command, wherein the set of trims includes a first trim defining a configuration of the resistive switching memory array and of program signal characteristics for implementing a physical unclonable feature (PUF) write command for the group of memory cells; and
   a memory controller configured to:
   determine whether the memory command is the PUF write command; and
   implement the PUF write command on a set of native resistive switching memory cells of the plurality of resistive switching memory cells that includes at least the group of memory cells in response to the memory command being the PUF write command.

2. The electronic device of claim 1, wherein the memory command is a memory write command, and further wherein the controller is configured to determine a write characteristic from the memory command and characterize the group of memory cells associated with the address consistent with the write characteristic.

3. The electronic device of claim 2, wherein the memory command includes one of: a one-time programmable (OTP) write command, a many-time programmable (MTP) write command, a random number generation (RNG) write command or the PUF write command.

4. The electronic device of claim 3, wherein:
   the communication from the host device includes data to be written to the group of memory cells in response to the memory command being the OTP write command or the MTP write command; and
   data written at least to the group of memory cells are exclusively digital 1 values, in response to the memory command being the RNG write command or the PUF write command.

5. The electronic device of claim 1, wherein the communication includes one or more bits transferred over the interface specifying the memory command from the set of memory commands.

6. The electronic device of claim 1, wherein the interface further comprises a hi/low pin setting associated with the memory command of the set of memory commands, and further wherein the second data specifying the memory command comprises the hi/low pin setting being set to a high value by the host device in conjunction with the communication.

7. The electronic device of claim 1, wherein the interface comprises respective hi/low pin settings for each memory command of the set of memory commands, and further wherein the second data specifying the memory command comprises one hi/low pin setting associated with the specified memory command being set to a high value by the host device and other hi/low pin settings remaining at a low setting in conjunction with the communication.

8. The electronic device of claim 1, wherein characterizing the group of memory cells as PUF memory cells further comprises determining that the group of memory cells are native memory cells having never previously experienced a program signal at the electronic device.

9. The electronic device of claim 8, wherein the memory controller is further configured to identify a second group of memory cells that are native memory cells and to group respective memory cells from the group of memory cells with respective memory cells from the second group of memory cells for differential PUF programming.

10. The electronic device of claim 1, wherein the memory controller is further configured to:
    characterize a second group of memory cells as random number generation (RNG) memory cells as specified by the set of trims in response to a second communication from the host device including third data indicative of a second address of the second group of memory cells and fourth data specifying a RNG write command from the set of memory commands; and implement the RNG write command at least on the second group of memory cells, comprising:
programming each of the second group of memory cells to a digital 1 value;
erasing each of the second group of memory cells to a digital 0 value; and
implement the PUF write command at least on the second group of memory cells.

11. A method for operating a memory controller of a resistive switching memory array comprising a plurality of resistive switching memory cells, comprising:
receiving a command from a host device external to the resistive switching memory array;
decoding the command to determine a selection of memory cells of the resistive switching memory array, the selection of memory cells being a portion of the plurality of resistive switching memory cells;
determine a memory operation to be implemented on the selection of memory cells in response to the command, the memory operation is determined to be one memory operation selected from a group of memory operations consisting of: a one-time programmable (OTP) memory operation, a many-time programmable (MTP) memory operation, a random number generation (RNG) memory operation and a physical unclonable feature (PUF) memory operation;
in response to determining the memory operation is the RNG memory operation or the PUF memory operation, enabling differential programming for the selection of memory cells; and
implementing the RNG memory operation or the PUF memory operation at least on the selection of memory cells.

12. The method of claim 11, further comprising: wherein determining the memory operation further comprises one of:
decoding the memory command from data included within the command;
inferring the memory command from an address location within the resistive switching memory array associated with the selection of memory cells; or
referencing a set of hi/low pins for a hi/low pin set to a hi setting by the host device and identifying a memory operation of a set of memory operations that is associated with the hi/low pin that is set to the hi setting.

13. The method of claim 11, further comprising:
identifying differential memory cells comprising a second portion of the plurality of resistive switching memory cells equal in number to the selection of memory cells;
coupling respective memory cells of the selection of memory cells and of the differential memory cells to define pairs of coupled memory cells that define respective differential bits; and
implementing the RNG memory operation or the PUF memory operation to generate RNG data or PUF data, respectively, at the selection of memory cells.

14. The method of claim 13, further comprising generating inverted RNG data or inverted PUF data, respectively, at the differential memory cells in response to implementing the RNG memory operation or the PUF memory operation.

15. The method of claim 13, wherein implementing the RNG memory operation or the PUF memory operation further comprises:
applying an electric pulse to the pairs of coupled memory cells;
identifying for each pair of coupled memory cells whether one of the selection of memory cells becomes programmed in response to the electric pulse or whether one of the differential memory cells becomes programmed in response to the electric pulse;
assigning a first digital value to a differential bit defined by a pair of coupled memory cells in response to a programmed memory cell being one of the selection of memory cells and assigning a second digital value to the differential bit in response to the programmed memory cell being one of the differential memory cells; and
assigning the first digital value or the second digital value to each differential bit based on whether one of the selection of memory cells or one of the differential memory cells becomes programmed for each differential bit.

16. A method, comprising:
receiving at a resistive switching memory device over an external command interface an instruction from a host device external to the resistive switching memory device;
decoding the instruction;
determining, from the decoded instruction, an address within an array of resistive switching memory associated with a group of resistive switching memory cells of the array;
in response to the address within the array of resistive switching memory having no pre-assigned characterization defining a memory command for the address:
determining a memory command from the decoded instruction or provided in conjunction with the instruction;
characterizing the group of resistive switching memory cells at the address according to the determined memory command; and
implementing the memory command at least on the group of resistive switching memory cells.

17. The method of claim 16, further comprising, in response to the address within the array of resistive switching memory having a pre-assigned characterization defining the memory command for the address, executing the memory command defined by the pre-assigned characterization at least on the group of resistive switching memory cells associated with the address, wherein the memory command is selected from a group consisting of: a one-time programmable (OTP) command, a many-time programmable (MTP) command, a random number generation (RNG) command and a physical unclonable feature (PUF) command.

18. The method of claim 16, wherein characterizing the group of resistive switching memory cells according to the determined memory command precludes implementing a memory command other than the determined memory command on the group of resistive switching memory cells.

19. The method of claim 16, wherein the memory command is a PUF write command, the group of resistive switching memory cells are native memory cells having never been programmed, and implementing the memory command further comprising:
identifying a second group of resistive switching memory cells having never been programmed;
coupling respective pairs of memory cells from the group of resistive switching memory cells and from the second group of resistive switching memory cells;
applying a program pulse to the respective pairs of memory cells and assigning digital values to the pairs of memory cells based on which memory cell of the respective pairs of memory cells becomes programmed in response to the program pulse; and storing the assigned digital values at one of: the group of resistive switching memory cells or the second group of resistive switching memory cells.

20. The method of claim 19, further comprising recharacterizing a second of: the group of resistive switching memory cells or the second group of resistive switching memory cells, as OTP memory cells, MTP memory cells or RNG memory cells following the storing the assigned digital values.

\* \* \* \* \*